(12) United States Patent
Ohgami et al.

(10) Patent No.: US 6,933,988 B2
(45) Date of Patent: Aug. 23, 2005

(54) ACTIVE MATRIX SUBSTRATE AND METHOD FOR PRODUCING THE SAME

(75) Inventors: Hiroyuki Ohgami, Kyoto (JP); Shinya Yamakawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 206 days.

(21) Appl. No.: 10/094,184

(22) Filed: Mar. 8, 2002

(65) Prior Publication Data

US 2002/0127857 A1 Sep. 12, 2002

(30) Foreign Application Priority Data

Mar. 8, 2001 (JP) ........................................ 2001-065806

(51) Int. Cl.[7] ............................................ G02F 1/1343
(52) U.S. Cl. ........................ 349/39; 349/38; 349/111; 349/141; 349/123; 349/42; 349/43; 349/139; 257/59; 257/72; 438/688; 438/689
(58) Field of Search ........................... 349/38, 39, 111, 349/141, 123, 42, 43, 139, 143, 44, 138; 257/59, 72; 438/688, 689

(56) References Cited

U.S. PATENT DOCUMENTS

| | | | | | |
|---|---|---|---|---|---|
| 5,781,254 | A | * | 7/1998 | Kim et al. | 349/44 |
| 5,844,641 | A | * | 12/1998 | Jun et al. | 349/38 |
| 5,969,782 | A | * | 10/1999 | Lee et al. | 349/141 |
| 5,977,563 | A | * | 11/1999 | Kubo et al. | 257/72 |
| 6,052,162 | A | * | 4/2000 | Shimada et al. | 349/38 |
| 6,522,369 | B2 | * | 2/2003 | Ohta et al. | 349/39 |

FOREIGN PATENT DOCUMENTS

JP  2-223922  *  9/1990

OTHER PUBLICATIONS

N. Shimada, et al., Japanese Laid-Open Publication No. 11-119261, published Apr. 30, 1990 and English Abstract.

* cited by examiner

*Primary Examiner*—Nathan J. Flynn
*Assistant Examiner*—Fazli Erdem
(74) *Attorney, Agent, or Firm*—David G. Conlin; David A. Tucker; Edwards & Angell, LLP

(57) ABSTRACT

An active matrix substrate includes: a plurality of scan lines and signal lines on a transparent insulative substrate which cross each other; a plurality of switching elements formed at predetermined intersections of the scan lines and signal lines, the switching elements being electrically connected to the scan lines and signal lines; a connection electrode electrically connected to a corresponding one of the switching elements; an interlayer insulating film formed over the scan lines, the signal lines, the connection electrode, and the switching elements; a contact hole formed in the interlayer insulating film over the connection electrode; and a pixel electrode at each intersection, the pixel electrode being electrically connected to the connection electrode through the contact hole, wherein each of the scan lines and signal lines includes an opaque electrode layer; and the contact hole is formed such that a portion of the contact hole exists outside the connection electrode.

6 Claims, 27 Drawing Sheets

(a)

(b)

(c)

(a)

(b)

(a)

(b)

(c)

(a)

(b)

(c)

(a)

(b)

(a)

(b)

[/////] Pixel electrode (a)

(d)

(b)

(e)

(c)

(f)

(a)

(b)

(c)

(a)

(b)

(c)

(d)

(e)

(f)

(a)

(d)

(b)

(e)

(c)

(f)

ACTIVE MATRIX SUBSTRATE AND METHOD FOR PRODUCING THE SAME

BACKGROUND OF THE INVENTION

1. Field of the Invention

The present invention relates to an active matrix substrate wherein each pixel, which is formed in a matrix, is driven by a switching element provided for each pixel. The present invention further relates to a method for producing such an active matrix substrate.

2. Description of the Related Art

In recent years, the size and weight of OA (Office Automation) apparatuses, such as personal computers and the like, have decreased, and commercial use of personal portable information apparatuses, or the like, has advanced. In such portable information apparatuses, a liquid crystal display (LCD) is most frequently used as a display device because of its small consumption of electric power, small size, and light weight.

In recent years, an even higher increase in the display quality of a LCD is in demand. Accordingly, an LCD based on an active matrix substrate having switching elements, each of which is provided to a respective pixel, has been widely used.

FIG. 35 is a schematic view showing a basic structure of an active matrix substrate 1 which is used in a liquid crystal display device.

The active matrix substrate 1 includes a plurality of scan lines 2 and a plurality of signal lines 3, which cross each other at right angle. Each of the scan lines 2 and each of the signal lines 3 are connected to a scan line driving circuit 4 and a signal line driving circuit 5, respectively. In each of the regions defined by the scan lines 2 and signal lines 3, a pixel 6 is formed, which is a minimum display unit for displaying an image on a display region. For each pixel 6, a thin film transistor (TFT) 7 is formed as a switching element at each intersection of the scan lines 2 and signal lines 3. A plurality of such pixels 6 are formed in a matrix over the active matrix substrate 1, so that the entire surface of the active matrix substrate 1 acts as a display region.

FIG. 36 shows an enlarged view of one of the pixels 6 of the active matrix substrate 1 shown in FIG. 35. Each scan line 2 is connected to a gate electrode 7a of the TFT 7, and each signal line 3 is connected to a source electrode 7b of the TFT 7. A drain electrode 7c of the TFT 7 is connected to a pixel electrode 8, which is provided to each pixel 6.

When the active matrix substrate 1 having the above structure is driven, the scan line driving circuit 4 applies a scan voltage to each of the plurality of scan lines 2 in a line-sequential manner. In response to application of the scan voltage, the gate electrode 7a of the TFT 7, which is connected to the scan line 2 to which the scan voltage is applied, turns on the conductive state between the source electrode 7b and the drain electrode 7c. The signal line driving circuit 5 applies a pixel voltage to each signal line 3 in synchronization with application of the scan voltage to the scan line 2, so as to write an image signal in the pixel electrode 8 of each of the pixel 6 which are in the on-state due to the application of the scan voltage.

Such an active matrix substrate 1, for example, an active matrix substrate as disclosed in Japanese Laid-Open Publication No. 11-119261, is known.

FIG. 37 is an enlarged plan view showing one of the pixels of the active matrix substrate 1. FIG. 38 is a cross-sectional view taken along line A–A' of FIG. 37.

The active matrix substrate 1 shown in FIG. 37 has a plurality of scan lines 2 over a transparent insulative substrate 11, such as glass, so as to be parallel to each other with a predetermined interval. At substantially a central portion between adjacent scan lines 2, an auxiliary capacitive line 12 is provided parallel to the scan lines 2. A gate electrode 7a of a TFT 7, which is formed for each pixel 6, is connected to the scan line 2. Over the entire surface of the transparent insulative substrate 11 including the scan lines 2, the signal lines 3, and the gate electrode 7a of the TFT 7, a gate insulating film 13 is formed. A semiconductor layer 14 is formed on a portion of the gate insulating film 13 which is above the gate electrode 7a. On a central portion of the semiconductor layer 14, a channel protecting layer 15 is formed. A source electrode 7b and drain electrode 7c formed of an n+ Si layer are provided so as to cover edges of the semiconductor layer 14 and the channel protecting layer 15.

On the gate insulating film 13, signal lines 3 are formed at predetermined intervals so as to cross each scan line 2 at right angles. Each signal line 3 has a two-layered structure including a transparent electrode layer 3a and a metal layer 3b, and is connected to the source electrode 7b of the TFT 7. On the other hand, the drain electrode 7c is connected to a connection electrode 16. The connection electrode 16 is connected to a pixel electrode 8 which writes a pixel voltage. The connection electrode 16 extends to a central portion of the pixel 6 where the auxiliary capacitive line 12 is formed, and is patterned so as to run along the auxiliary capacitive line 12.

An interlayer insulating film 17 is formed on the TFT 7, the connection electrode 16, the scan line 2, and the signal line 3. In the interlayer insulating film 17, a contact hole 18 is formed above the auxiliary capacitive line 12 so as to reach the connection electrode 16. Over the interlayer insulating film 17, the pixel electrode 8 is formed over the entire region of each pixel 6 so as to be in electrical contact with the connection electrode 16 through the contact hole 18.

In the above-described active matrix substrate 1 of the conventional liquid crystal display device, the transparent insulative substrate 11 is typically made of a glass substrate. However, the glass substrate is heavy and easily broken when dropped to the ground, for example. Thus, such a glass substrate is not fit for use in a light-weighted portable information apparatus which is required to be deformation-resistant and to be not easily broken upon impact on the ground or the like.

Therefore, plastic has been receiving attention as a material for the transparent insulative substrate 11 which is light weight and is deformation- and shock-resistant. Research has been carried out for using plastic as a material of the transparent insulative substrate 11 of the active matrix substrate 1.

However, a plastic substrate differs from a glass substrate in that the size of the plastic substrate largely varies in accordance with its environment during a production process. For example, the glass substrate has a variation rate against temperature of 3 to 5 ppm/° C., while the plastic substrate has a variation rate against temperature of 50 to 100 ppm/° C. Further, the size of the plastic substrate varies when it absorbs moisture. The variation rate in a size of the plastic substrate is about 3000 ppm. Thus, when such a plastic substrate is used, it is necessary to determine the structure of each component of the active matrix substrate in consideration of such variations in size which may be caused by environmental variations.

A conventional substrate made of plastic will now be described with reference to FIG. 39. FIG. 39 is an enlarged plan view showing one of the pixels of the active matrix substrate 1 which is formed on the transparent insulative substrate 11 made of plastic. Section (a) shows a pixel of an active matrix substrate in which an auxiliary capacitive line 12 is formed. Section (b) shows a pixel of an active matrix substrate in which an auxiliary capacitive line 12 is not formed.

In FIG. 40, sections (a) through (f) illustrate steps of a method for producing the active matrix substrate 1 shown in section (a) of FIG. 39.

The method for producing the active matrix substrate 1 shown in section (a) of FIG. 39, in which variations in the size of the transparent insulative substrate 11 made of plastic are considered, is described with reference to FIGS. 40 through 42.

In the first step, as shown in section (a) of FIG. 40, on the transparent insulative substrate 11 made of transparent plastic, scan lines 2 and an auxiliary capacitive line 12 are formed of opaque metal so as to be in parallel to each other.

Next, a gate insulating film 13 is formed over the entire structure of the insulative substrate 11. On the gate insulating film 13, an amorphous Si layer 21 and an $n^+$ amorphous Si layer 22, which will be formed into a source electrode 7a and a drain electrode 7b in a subsequent step, are formed (see FIG. 41). Then, a positive-type photoresist is formed on the $n^+$ amorphous Si layer 22 and patterned by exposing both the upper and lower surfaces of the structure to light, such that the photoresist is left only on the scan lines 2. The resultant structure is etched using this photoresist as a mask so as to form a stripe pattern of the amorphous Si layer 21 and the $n^+$ amorphous Si layer 22 on the scan lines 2 as shown in section (b) of FIG. 40. FIG. 41 is a cross-sectional view taken along line B–B' of section (b) of FIG. 40. FIG. 41 shows the amorphous Si layer 21 and the $n^+$ amorphous Si layer 22, which are formed on the scan lines 2 and which run along the scan lines 2.

Next, signal lines 3 and a connection electrode 16 are patterned as shown in section (c) of FIG. 40.

In FIG. 42, sections (a) through (c) are cross-sectional views taken along line C–C' of section (c) of FIG. 40, which illustrate steps of forming the signal lines 3 and the connection electrode 16 patterned as shown in section (c) of FIG. 40.

In this case, in the first place, as shown in section (a) of FIG. 42, a transparent electrode layer 23 of a light-permeable, electrically-conductive material such as ITO, which will be a lower electrode layer of the signal lines 3 and a connection electrode 16, and an opaque electrode layer 24 of an light-impermeable, electrically-conductive material, which will be an upper electrode layer of the signal lines 3 and a connection electrode 16, are sequentially formed. Thereafter, a photoresist layer 25 is formed for patterning the signal lines 3 and a connection electrode 16.

The photoresist layer 25 formed on the opaque electrode layer 24 has a portion which has been partially exposed to light as shown in section (a) of FIG. 42 (half exposure portion 25a), which will be a channel portion of the TFT. The half exposure portion 25a is formed through a half exposure process where a half-tone mask or a slit-shaped mask is used to insufficiently expose a corresponding portion of the photoresist 25, such that the insufficiently-exposed portion (i.e., half exposure portion 25a) becomes thinner than the other portions of the photoresist 25. After such a photoresist 25 has been formed, the photoresist 25 is used as a mask so as to etch away unmasked portions of the opaque electrode layer 24, the transparent electrode layer 23, the $n^+$ amorphous Si layer 22, and the amorphous Si layer 21 as shown in section (b) of FIG. 42. Then, the resist in the half exposure portion 25a is removed, and portions of the opaque electrode layer 24, the transparent electrode layer 23, and the $n^+$ amorphous Si layer 22 in the half exposure portion 25a are etched away so as to form a source electrode 7b and a drain electrode 7c on the amorphous Si layer 21 as shown in section (c) of FIG. 42.

In this example, in the active matrix substrate 1, the signal lines 3 and a connection electrode 16 each have a two-layered structure including the transparent electrode layer 23 made of ITO, or the like, and the opaque electrode layer 24. However, the signal lines 3 and a connection electrode 16 may be formed by only the opaque electrode layer 24.

According to the above method, the TFT 7, which functions as a switching element, can be accurately formed even when a displacement is caused in the alignment of the patterns of the signal lines 3, the source electrode 7b of the TFT 7, and the drain electrode 7c of the TFT 7, with respect to the pattern of the scan lines 2, due to extension and contraction of the insulative substrate 11 which may occur after formation of the scan lines 2.

Next, a TFT protection film 26 (FIG. 43) of $SiN_x$ or the like is formed over the entire upper surface of the insulative substrate 11. On the TFT protection film 26, an interlayer insulating film 17 is formed of a photosensitive organic resin material so as to cover the entire resultant structure.

In the active matrix substrate 1, a two-layered structure including the TFT protection film 26 of $SiN_x$ and the interlayer insulating film 17 of an organic resin material is formed on the signal line 3 or the like. However, only an inorganic layer of $SiN_x$, or the like, may be formed on the signal line 3.

Next, a contact hole 18 is formed in the interlayer insulating film 17 above the auxiliary capacitive line 12 so as to reach the TFT protection film 26 as shown in section (d) of FIG. 40. Then, the interlayer insulating film 17 is used as a mask to etch the TFT protection film 26 in the contact hole 18.

FIG. 43 is a cross-sectional view taken along line D–D' of section (d) of FIG. 40. FIG. 43 shows a structure where the contact hole 18 formed in the interlayer insulating film 17 reaches the connection electrode 16 beneath the TFT protection film 26.

Next, a transparent electrode layer of ITO or the like, which will be a pixel electrode 8, is formed by sputtering. On this transparent electrode layer, a photoresist layer is formed for patterning the pixel electrode 8, and the photoresist layer is formed into a predetermined pattern through an exposure step.

If the transparent insulative substrate 11 made of plastic is subjected to a normal exposure step, a change in size of the transparent insulative substrate 11 is caused so that the pixel electrode 8 cannot be formed at a desired position. Thus, in the case of the transparent insulative substrate 11 made of plastic, a negative-type photoresist is used to expose the lower surface of the transparent insulative substrate 11 (on which the pixel electrode 8 is not formed) such that the resist layer is left only in regions where the scan lines 2 and the signal lines 3 are not formed, and accordingly, light is transmitted therethrough. (Hereinafter, an exposure process achieved by emitting light from a lower side of the transparent insulative substrate 11 is referred to as a "back surface exposure" process.) In this way, the pattern of the resist layer for forming the pixel electrode 8 is formed. However, in this case where only the exposure of the lower surface is performed, the resist layer is not left in a region over the connection electrode 16 where the contact hole 18 is to be formed. Thus, after the exposure of the lower surface of the transparent insulative substrate 11, the resulting structure is exposed to light from the upper surface side of the transparent insulative substrate 11 so that the resist layer is left in region E shown in section (e) of FIG. 40. (Hereinafter, an exposure process achieved by emitting light from an upper side of the transparent insulative substrate 11 is referred to as a "front surface exposure" process.)

Next, the thus-formed resist layer is used as a mask to pattern the transparent electrode layer made of ITO, or the like, into a desired shape so as to form a pixel electrode 8 for each pixel 6 as shown in section (f) of FIG. 40.

FIG. 44 shows the pixel electrode 8 formed by using the above photoresist. As described above, the pixel electrode 8 is formed for each pixel 6 using the photoresist pattern (indicated by slanted lines in FIG. 44), which is formed by exposure with light from the upper and lower sides of the resulting structure.

FIG. 45 is a cross-sectional view taken along line F–F' of section (f) of FIG. 40. FIG. 45 shows a structure where the pixel electrode 8 formed on the interlayer insulating film 17 is electrically connected to the opaque electrode layer 24 of the connection electrode 16 through the contact hole 18. FIG. 46 is a cross-sectional view taken along line G–G' of section (f) of FIG. 40. FIG. 46 shows that the pixel electrode 8 is formed on the inter layer insulating film 17 for each pixel 6.

According to the conventional production method described above, the active matrix substrate 1 wherein the pixel electrode 8 is formed on the interlayer insulating film 17 is completed.

In the active matrix substrate 1 described above, the connection electrode 16 is formed on the auxiliary capacitive line 12, and a portion of the connection electrode 16 also functions as an electrode for the auxiliary capacitance. However, as shown in section (b) of FIG. 39, the active matrix substrate 1 in which the auxiliary capacitive line 12 is not formed, and the connection electrode 16 does not form a part of the auxiliary capacitance may be produced.

In the case where an insulative substrate made of a material having flexibility, such as plastic or the like, is used as the insulative substrate 11 of the active matrix substrate 1, the exposure area, in which a photoresist layer is formed for forming the contact hole 18, the connection electrode 16, and the pixel electrode 8 by etching, is restricted. Hereinafter, this restriction is described with reference to sections (a) and (b) of FIG. 39. In the following description, the maximum amount of displacement between a position where the pattern of an electrode structure is to be formed through the exposure step and a position where the pattern is actually formed through the exposure step, which is cause due to an extension/contraction of the plastic insulative substrate 11 is represented by "Δ". A maximum amount of displacement, "Δ", which the position of the electrode structure can have and still operate as intended, is referred to as an "alignment margin". For example, in the pixel structure shown in section (a) of FIG. 39, the following three types of alignment margins (1) to (3) must be considered.

(1) The contact hole 18 must be formed on the connection electrode 16 so as to electrically connect the pixel electrode 8 to the connection electrode 16. Thus, the pattern of the connection electrode 16 requires an alignment margin greater than 2Δ in all directions, while the contact hole 18 requires an alignment margin of Δ.

(2) The photoresist layer used for forming the pixel electrode 8 must be formed by back surface exposure and front surface exposure which is performed for compensating for the back surface exposure so as to form the photoresist layer over the connection electrode 16. In order to form the pixel electrode 8 using such a photoresist layer as a mask such that the pixel electrode 8 is connected to the connection electrode 16 through the contact hole 18, the exposure pattern used for the front surface exposure must have an alignment margin of 2Δ from at least one of the opposite edges of the connection electrode 16.

Further, when the auxiliary capacitive line 12 and the like are formed in the central region of the pixel 6, and the pixel electrode 8 is divided by the auxiliary capacitive line 12 and the like, as shown in section (a) of FIG. 39, each of the divided regions requires an alignment margin greater than that of the connection electrode 16 by 2Δ. It should be noted that, when a connection electrode 16 is not formed on the auxiliary capacitive line 12 as shown in section (b) of FIG. 39, it is not necessary to consider such an alignment margin.

(3) The resist pattern which is formed by the back surface exposure is used as a mask for forming the pixel electrodes 8 between the signal lines 3 such that adjacent pixel electrodes 8 are divided by a signal line 3 therebetween. However, if the exposure pattern is formed by the front surface exposure so as to be superposed on the signal lines 3, the pixel electrodes 8 cannot be formed separately between adjacent pixels 6. Thus, when front surface exposure is performed, it is necessary to consider an alignment margin of 2Δ between the signal lines 3 and the exposure pattern formed therebetween.

When the above alignment margins (1)–(3) are considered, in order to produce an active matrix substrate using the insulative substrate 11 made of plastic, the photoresist layer, which is exposed for forming the contact hole 18, the connection electrode 16, and the pixel electrode 8, need to be formed with an alignment margin equal to or greater than at least 8Δ in a direction along the width of the pixel electrode 8 (i.e., a pitch of the signal lines 3) as shown in sections (a) and (b) of FIG. 39. Specifically, for example, in the case where the photoresist pattern used for forming the contact hole 18 requires an alignment margin Δ of 20 μm, the pitch of the signal lines 3 cannot be made smaller than about 160 μm (8Δ) at the minimum.

In recent years, there has been demand for pixels to be formed at higher density. Specifically, a pitch of about 50 to 100 μm is required as a size of a pixel electrode. Thus, a decrease in the pitch between signal lines is essential in producing an active matrix substrate using an insulative substrate 11 having flexibility, such as a plastic substrate, so as to have pixel electrodes formed at higher density.

SUMMARY OF THE INVENTION

According to one aspect of the present invention, an active matrix substrate includes: a plurality of scan lines formed on a transparent insulative substrate; a plurality of signal lines formed so as to cross the scan lines; a plurality of switching elements formed at predetermined intersections of the scan lines and the signal lines, the switching elements being electrically connected to the scan lines and the signal lines; a connection electrode formed for each of the intersections so as to be electrically connected to a corresponding one of the switching elements; an interlayer insulating film formed over the scan lines, the signal lines, the connection electrode, and the switching elements; a contact hole formed in the interlayer insulating film over the connection electrode; and a pixel electrode formed over the interlayer insulating film at each of the intersections, the pixel electrode being electrically connected to the connection electrode through the contact hole, wherein each of the scan lines and the signal lines includes an opaque electrode layer; and the contact hole is formed such that a portion of the contact hole exists outside the connection electrode.

In one embodiment of the present invention, the contact hole is formed into a linear shape such that one end or opposite ends of the contact hole exist outside the connection electrode.

In another embodiment of the present invention, the connection electrode is not present in the contact hole.

In still another embodiment of the present invention, the connection electrode has a layered film including a transparent electrode layer as a lowermost layer and an opaque electrode layer provided on the transparent electrode layer; and the opaque electrode layer is not present in the contact hole.

In still another embodiment of the present invention, the connection electrode is not present in the contact hole.

In still another embodiment of the present invention, the connection electrode has a layered film including a transparent electrode layer as a lowermost layer and an opaque electrode layer provided on the transparent electrode layer; and the opaque electrode layer is not present in the contact hole.

According to another aspect of the present invention, a method for producing an active matrix substrate includes steps of: forming a plurality of scan lines on a transparent insulative substrate so as to be parallel to each other, each scan line including an opaque electrode layer; forming a gate insulating film on each of the scan lines; forming a plurality of signal lines on the gate insulating film so as to cross the scan lines, each signal line including an opaque electrode layer; forming a switching element at a predetermined intersection of each scan line and each signal line so as to be electrically connected to the scan line and the signal line; forming a connection electrode for each predetermined intersection so as to be electrically connected to the switching element; forming an interlayer insulating film over the scan lines, the signal lines, the connection electrode, and the switching elements; forming a contact hole in the interlayer insulating film such that a portion of the contact hole exists outside a circumference of the connection electrode; forming a transparent conductive film on the interlayer insulating film; forming a negative-type photoresist over the transparent conductive film; forming in the negative-type photoresist a pattern used for forming a pixel electrode by performing back surface exposure using the scan lines, the signal lines, and the connection electrode as masks; and forming the transparent conductive layer into a pixel electrode by using the patterned negative-type photoresist as a mask.

Thus, the invention described herein makes possible the advantages of providing an active matrix substrate where pixel electrodes are formed at a higher density on a substrate having flexibility, such as a plastic substrate, and providing a method for producing the same.

These and other advantages of the present invention will become apparent to those skilled in the art upon reading and understanding the following detailed description with reference to the accompanying figures.

Figure 2:
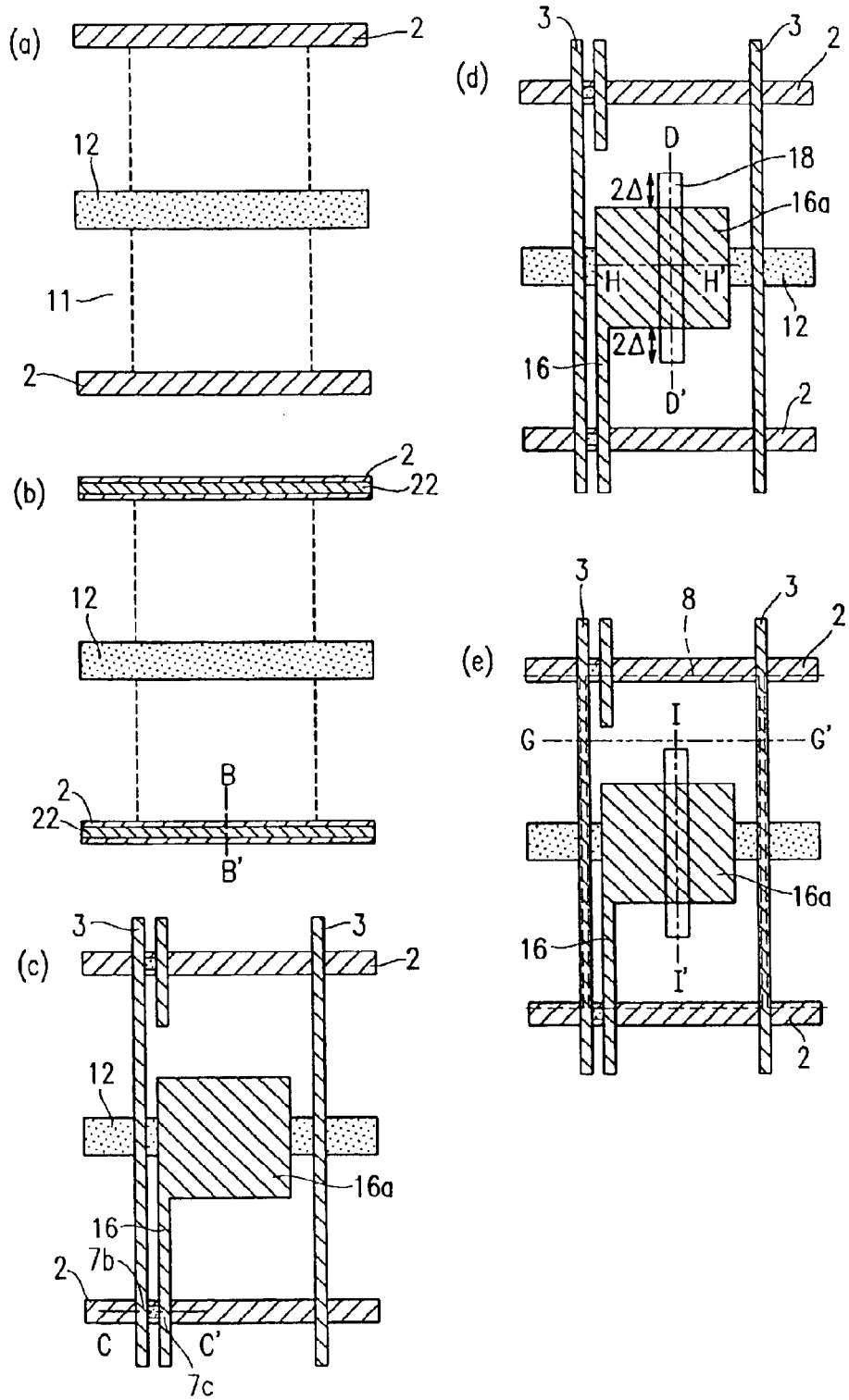

Sections (a) through (e) of FIG. 2 are plan views illustrating steps of a method for producing the active matrix substrate according to embodiment 1 of the present invention.

Figure 3:
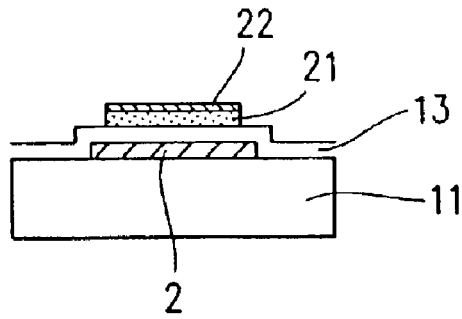

FIG. 3 is a cross-sectional view taken along line B–B' of section (b) of FIG. 2.

Figure 4:
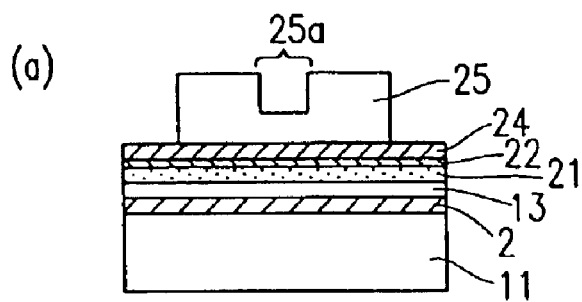
Figure 4:
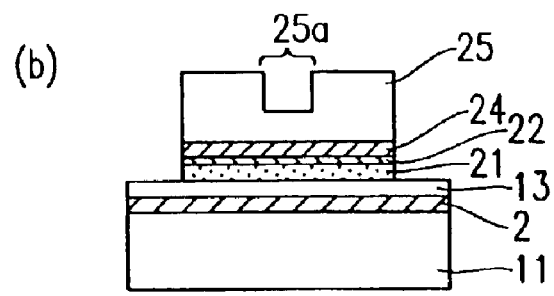
Figure 4:
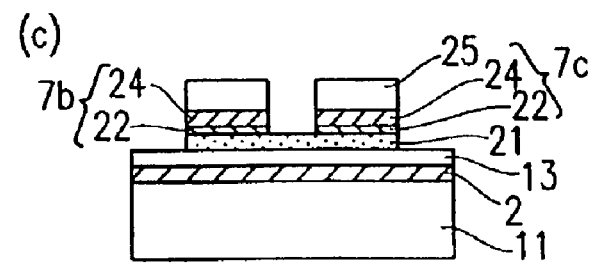

Sections (a) to (a) of FIG. 4 are cross-sectional views taken along line C–C' of section (c) of FIG. 2, which illustrate steps of patterning signal lines and a connection electrode.

Figure 5:
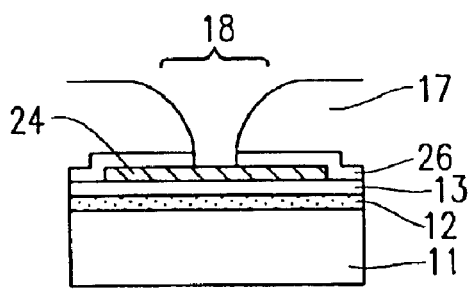
Figure 5:
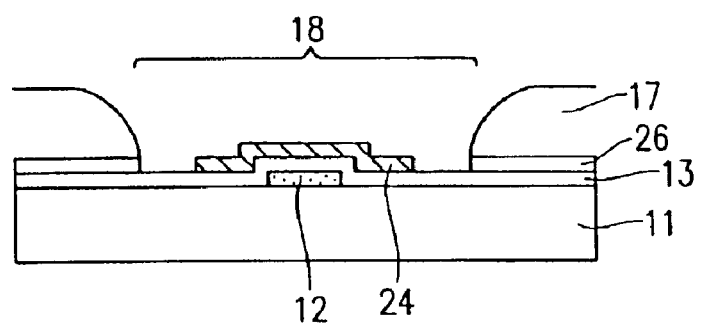

Section (a) of FIG. 5 is a cross-sectional view taken along line H–H' of section (d) of FIG. 2. Section (b) of FIG. 5 is a cross-sectional view taken along line D–D' of section (d) of FIG. 2.

Figure 6:
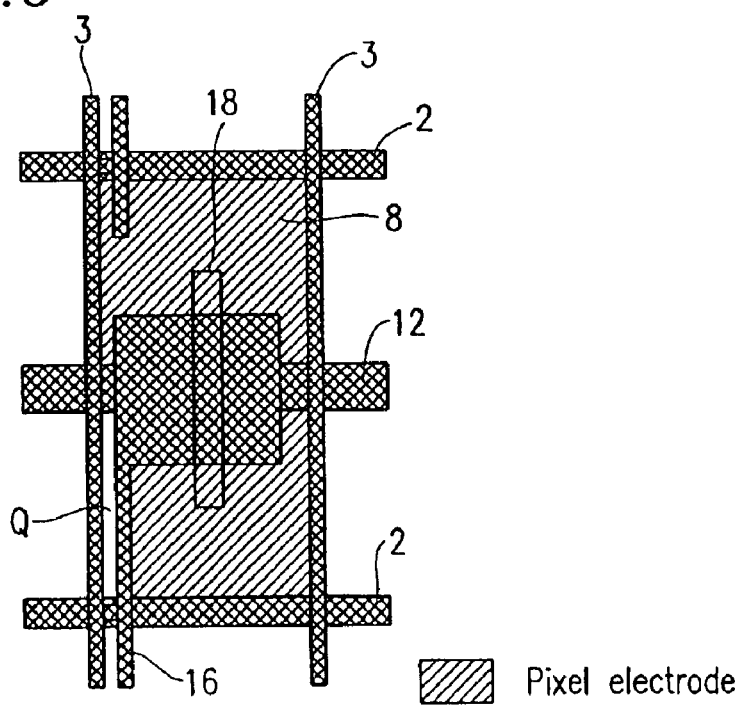

FIG. 6 is a plan view showing a pixel electrode formed by using a photoresist patterned by back surface exposure.

Figure 7:
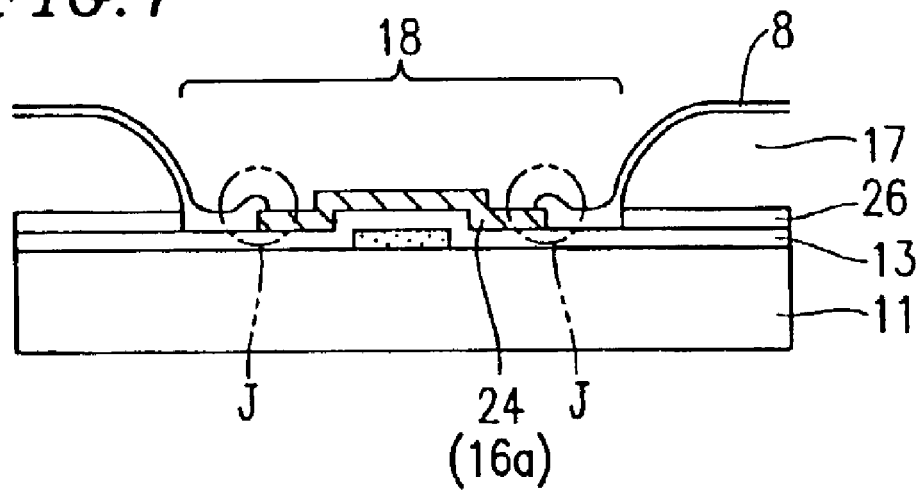

FIG. 7 is a cross-sectional view taken along line I–I' of section (e) of FIG. 2.

Figure 8:
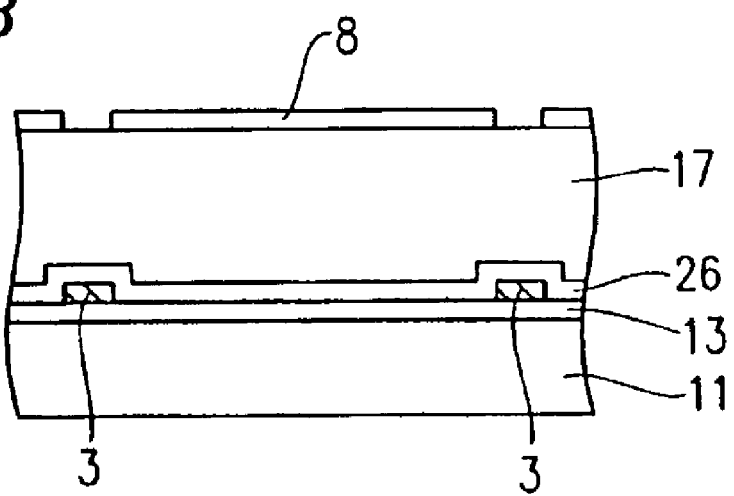

FIG. 8 is a cross-sectional view taken along line G–G' of section (e) of FIG. 2.

Figure 9:
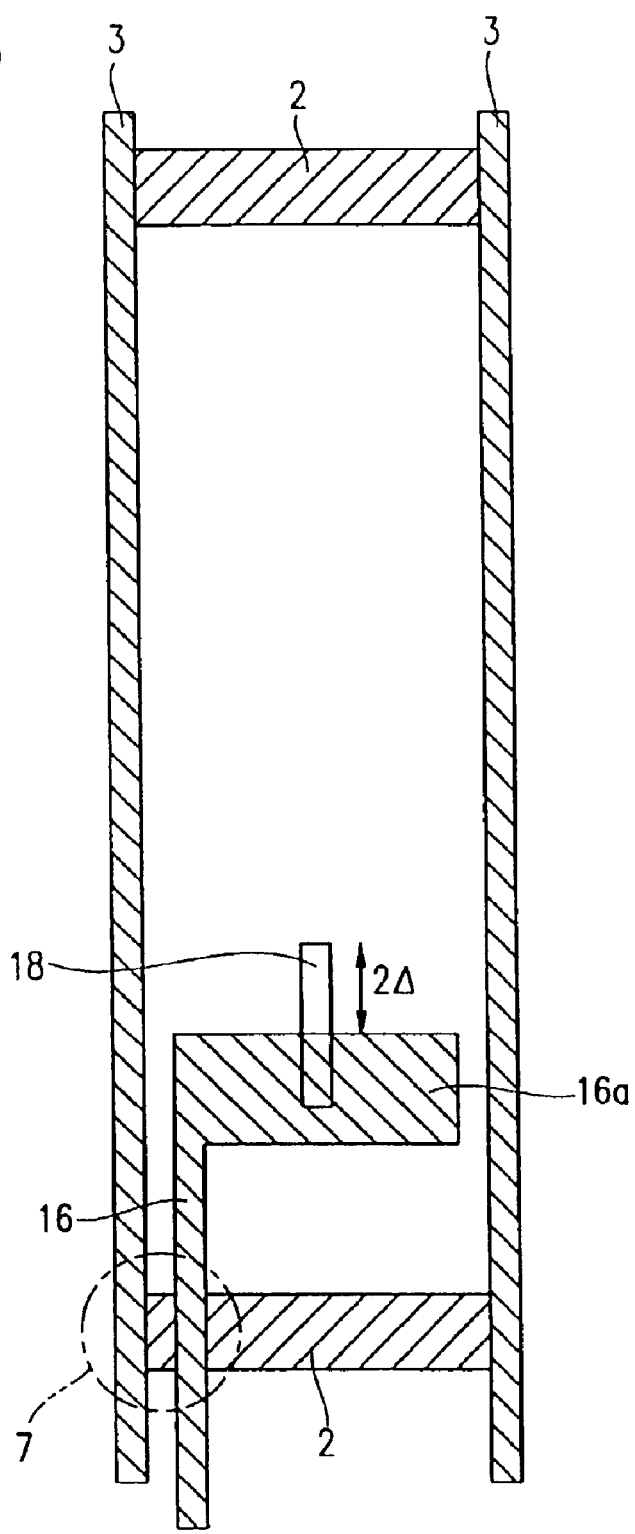

FIG. 9 is an enlarged schematic plan view showing a pixel of an active matrix substrate according to embodiment 2.

Figure 10:
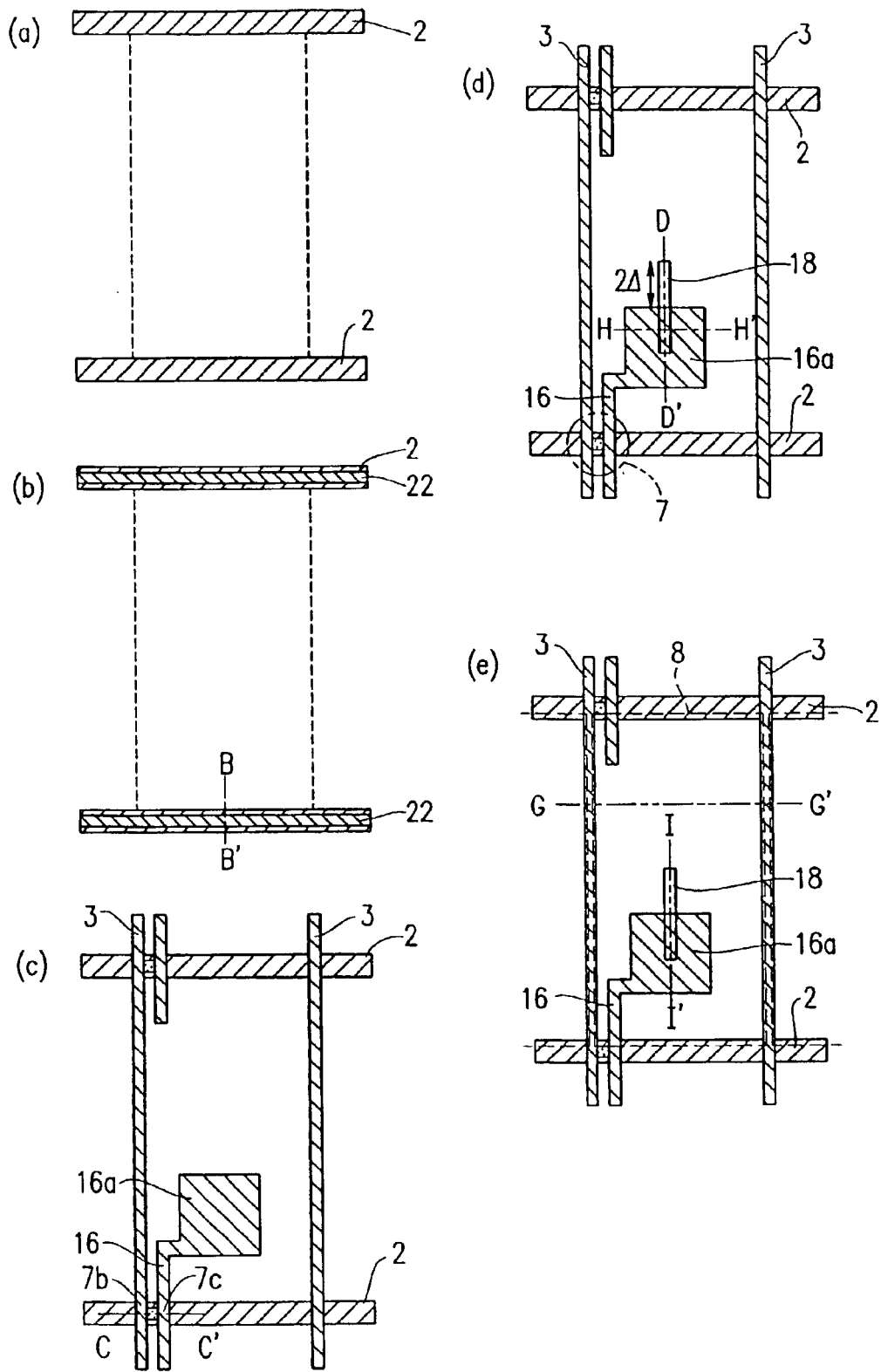

Sections (a) through (e) of FIG. 10 are plan views illustrating steps of a method for producing the active matrix substrate according to embodiment 2 of the present invention.

Figure 11:
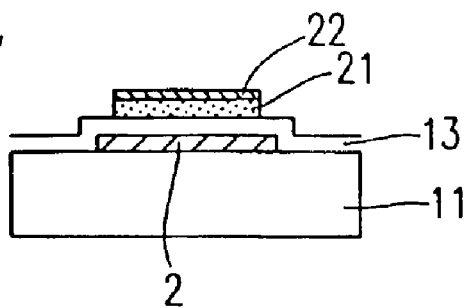

FIG. 11 is a cross-sectional view taken along line B–B' of section (b) of FIG. 10.

Figure 12:
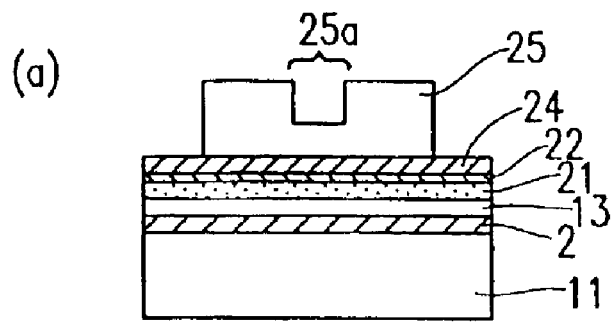
Figure 12:
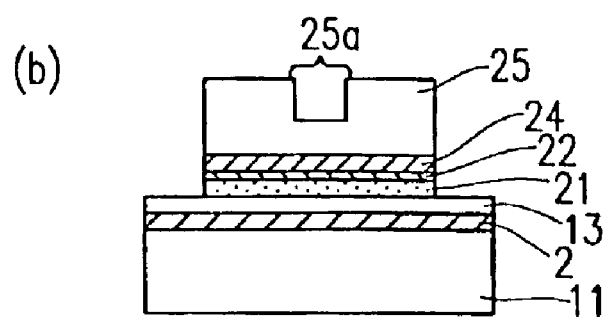
Figure 12:
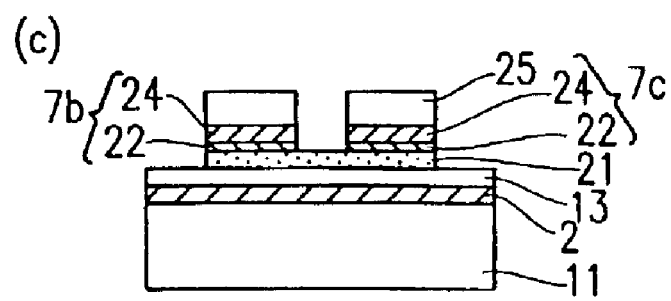

Sections (a) to (c) of FIG. 12 are cross-sectional views taken along line C–C' of section (c) of FIG. 10, which illustrate steps of patterning signal lines and a connection electrode.

Figure 13:
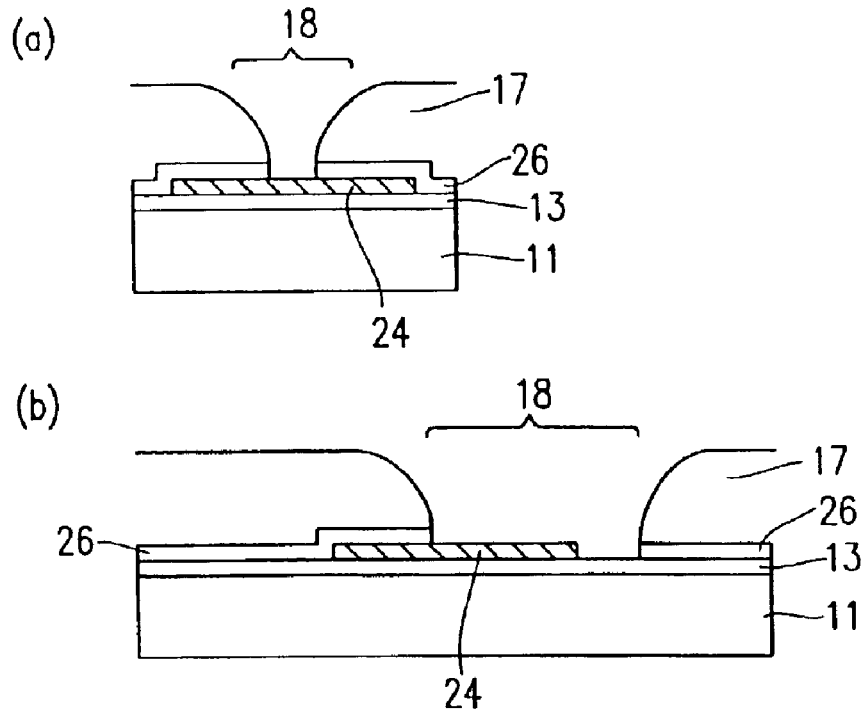

Section (a) of FIG. 13 is a cross-sectional view taken along line H–H' of section (d) of FIG. 10. Section (b) of FIG. 13 is a cross-sectional view taken along line D–D' of section (d) of FIG. 10.

Figure 14:
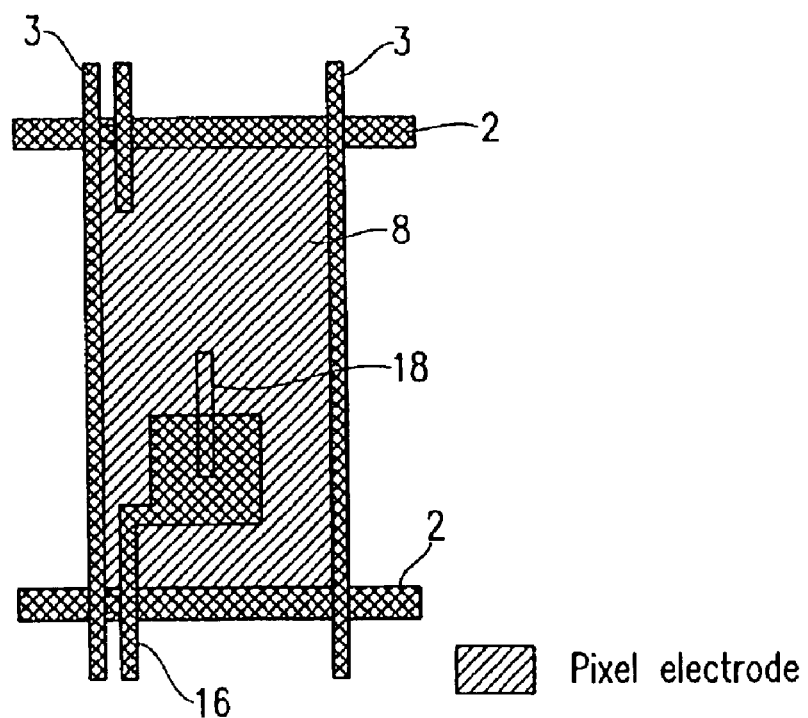

FIG. 14 is a plan view showing a pixel electrode formed by using a photoresist patterned by back surface exposure.

Figure 15:
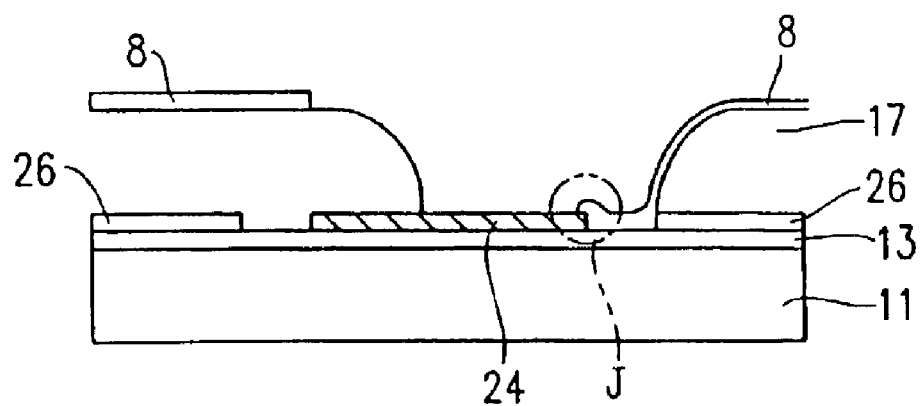

FIG. 15 is a cross-sectional view taken along line I–I' of section (e) of FIG. 10.

Figure 16:
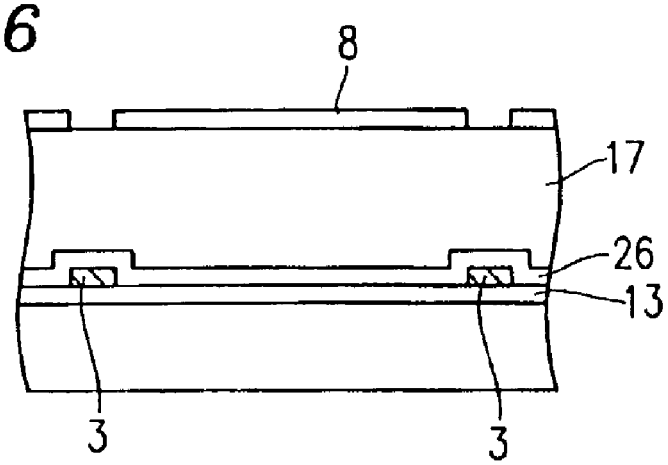

FIG. 16 is a cross-sectional view taken along line G–G' of section (e) of FIG. 10.

Figure 17:
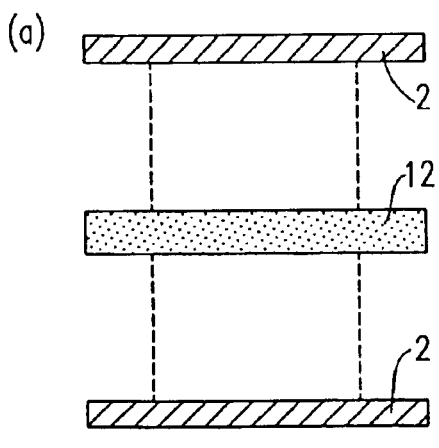
Figure 17:
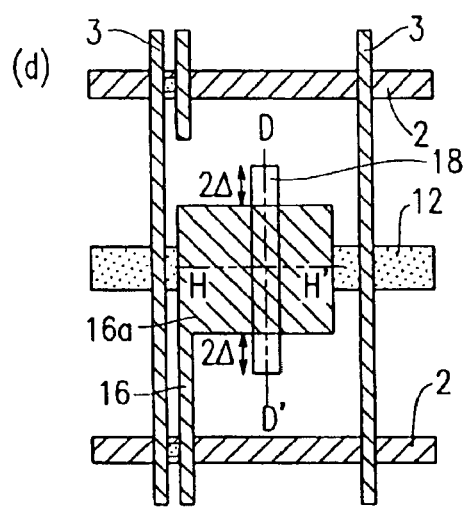
Figure 17:
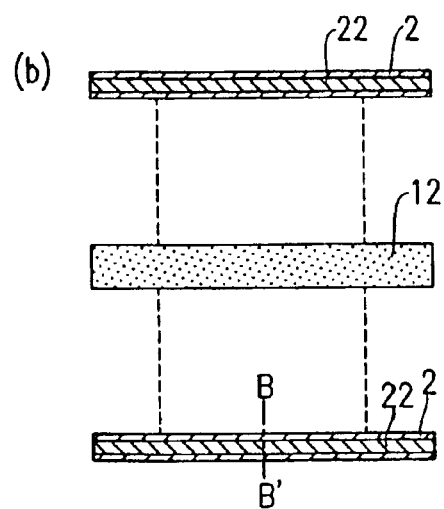
Figure 17:
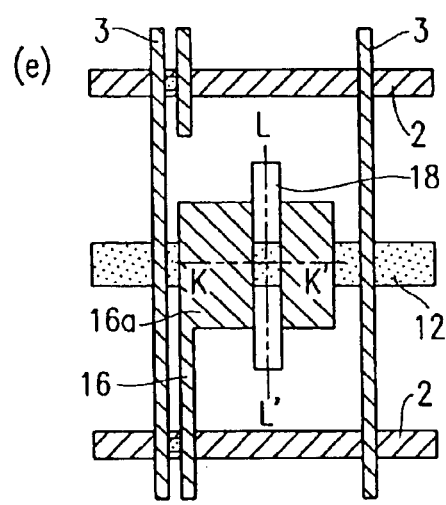
Figure 17:
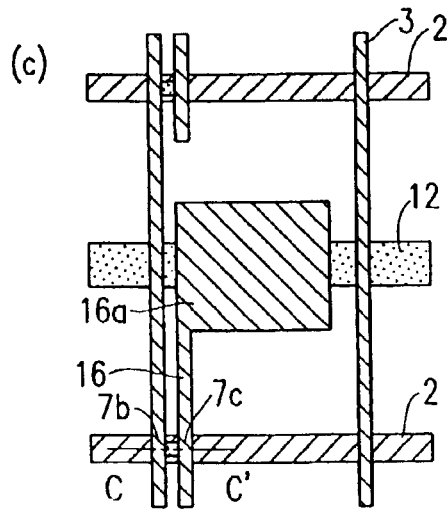
Figure 17:
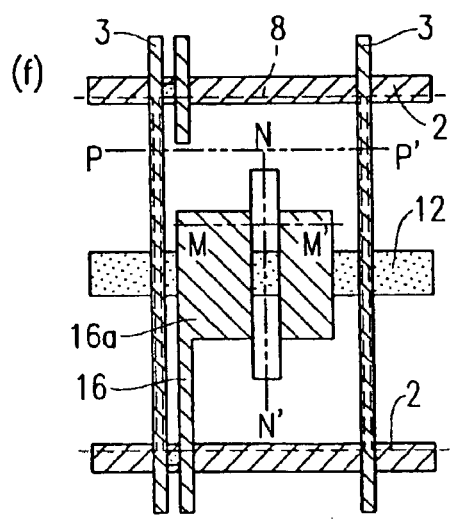

Sections (a) through (f) of FIG. 17 are plan views illustrating steps of a method for producing the active matrix substrate according to embodiment 3 of the present invention.

Figure 18:
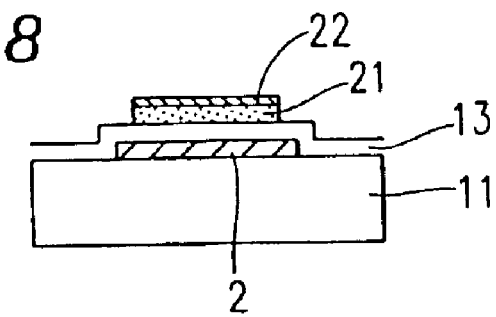

FIG. 18 is a cross-sectional view taken along line B–B' of section (b) of FIG. 17.

Figure 19:
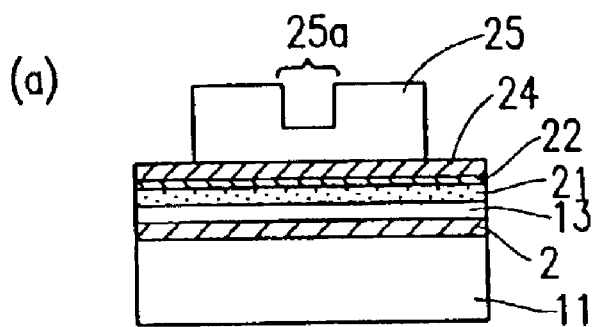
Figure 19:
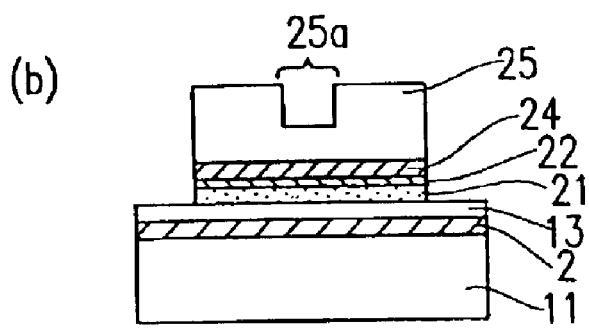
Figure 19:
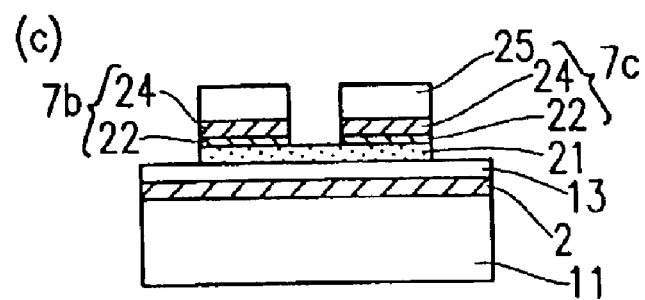

Sections (a) to (c) of FIG. 19 are cross-sectional views taken along line C–C' of section (c) of FIG. 17, which illustrate steps of patterning the signal lines 3 and the connection electrode 16.

Figure 20:
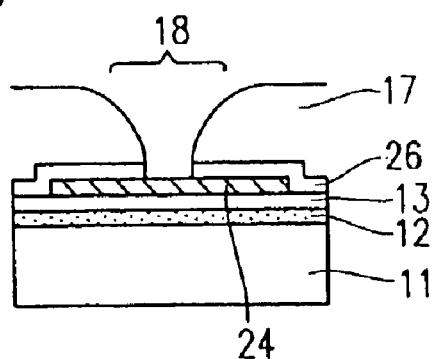
Figure 20:
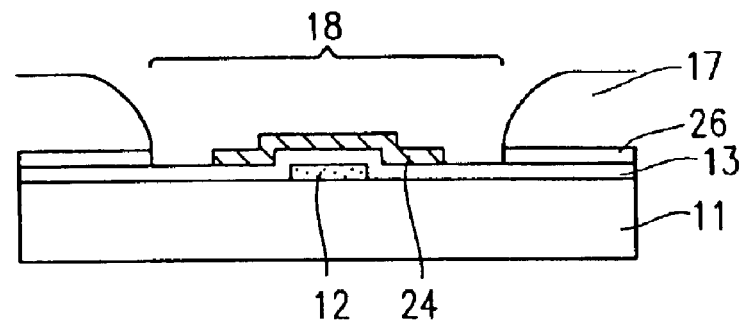

Section (a) of FIG. 20 is a cross-sectional view taken along line H–H' of section (d) of FIG. 17. Section (b) of FIG. 20 is a cross-sectional view taken along line D–D' of section (d) of FIG. 17.

Figure 21:
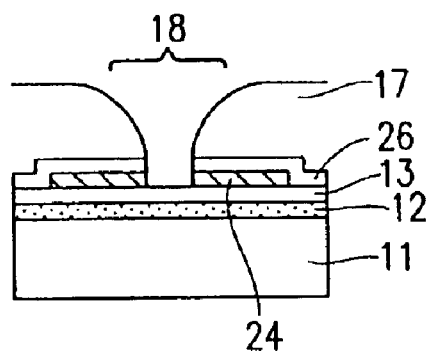
Figure 21:
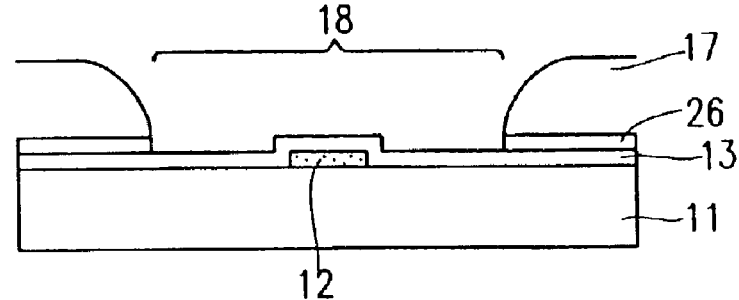

Section (a) of FIG. 21 is a cross-sectional view taken along line K–K' of section (e) of FIG. 17. Section (b) of FIG. 21 is a cross-sectional view taken along line L–L' of section (e) of FIG. 17.

Figure 22:
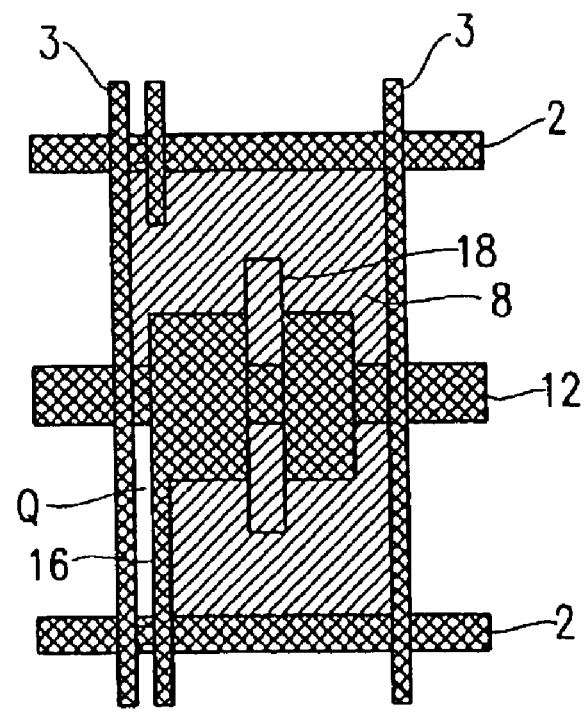

FIG. 22 is a plan view showing a pixel electrode formed by using a photoresist patterned by back surface exposure.

Figure 23:
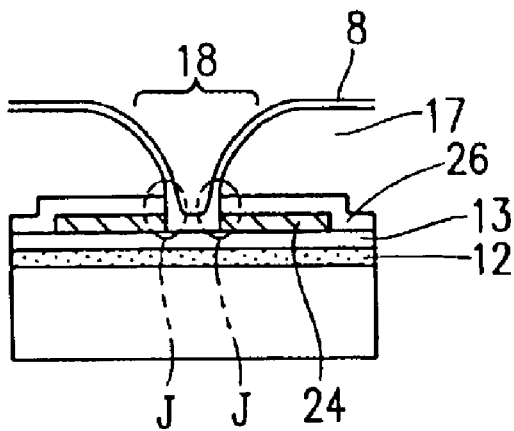

FIG. 23 is a cross-sectional view taken along line M–M' of section (f) of FIG. 17.

Figure 24:
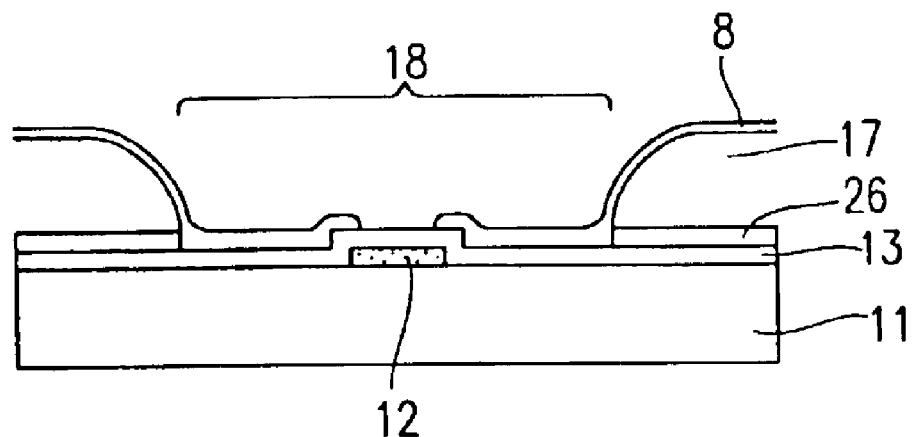

FIG. 24 is a cross-sectional view taken along line N–N' of section (f) of FIG. 17.

Figure 25:
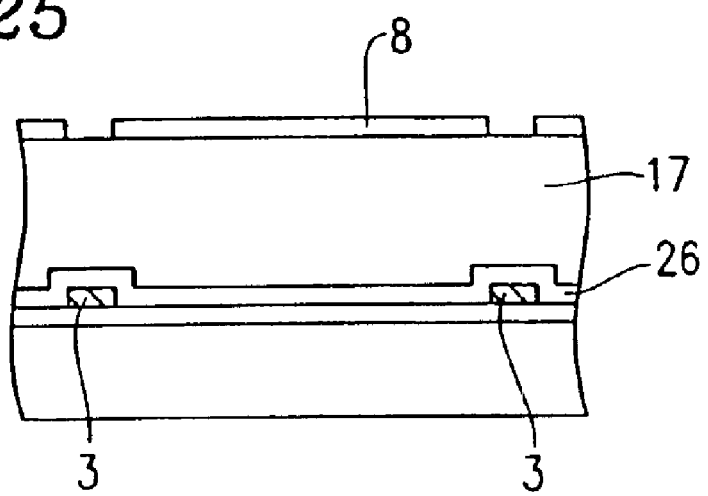

FIG. 25 is a cross-sectional view taken along line P–P' of section (f) of FIG. 17.

Figure 26:
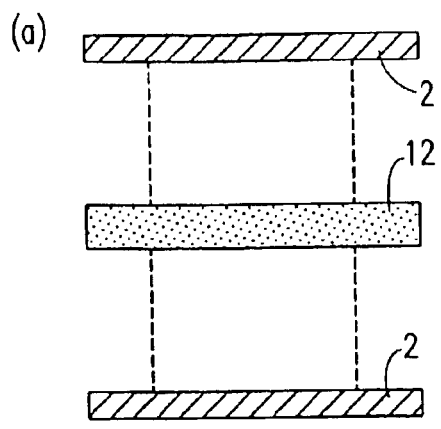
Figure 26:
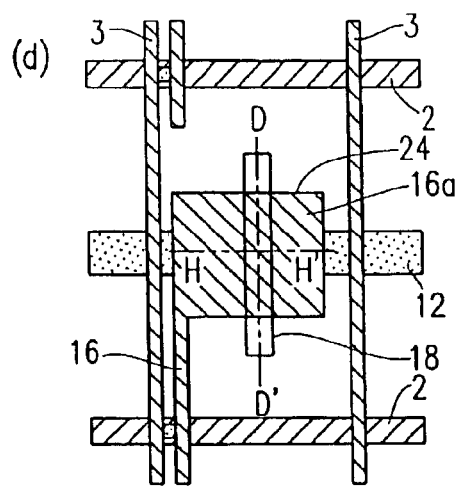
Figure 26:
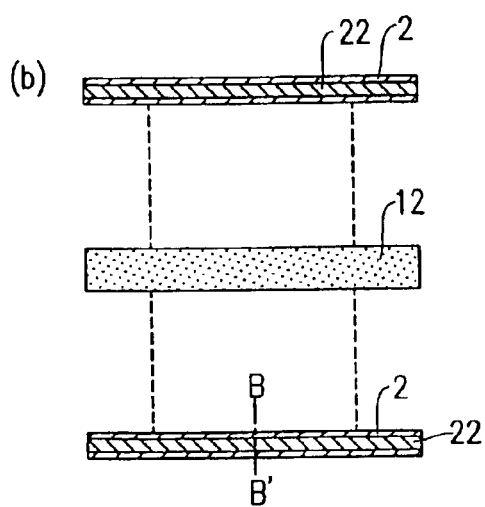
Figure 26:
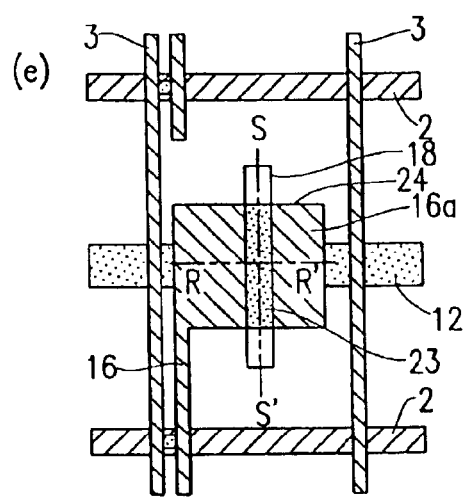
Figure 26:
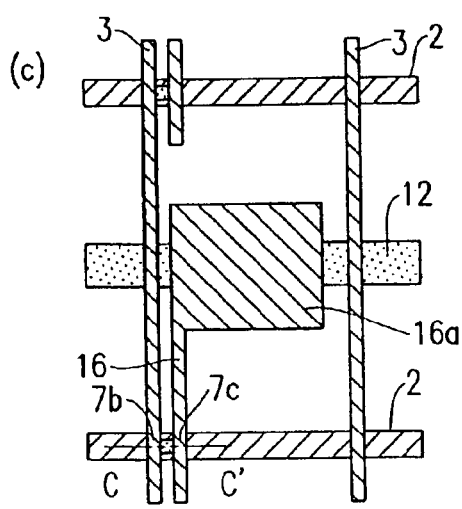
Figure 26:
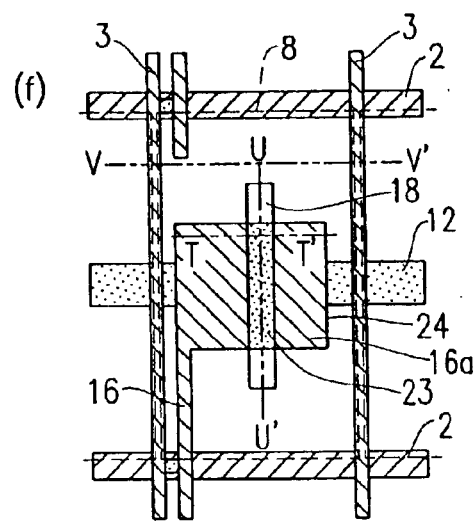

Sections (a) through (f) of FIG. 26 are plan views illustrating steps of a method for producing the active matrix substrate according to embodiment 4 of the present invention.

Figure 27:
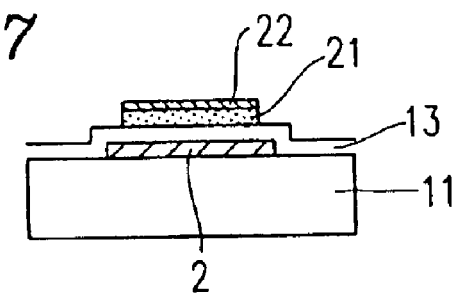

FIG. 27 is a cross-sectional view taken along line B–B' of section (b) of FIG. 26.

Figure 28:
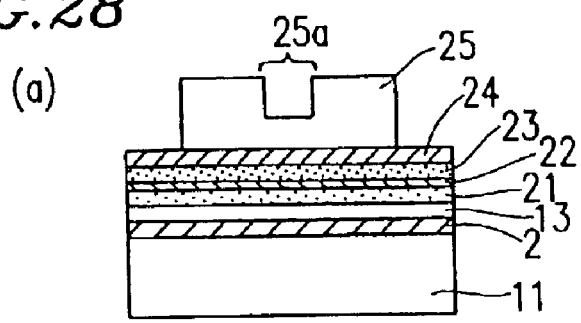
Figure 28:
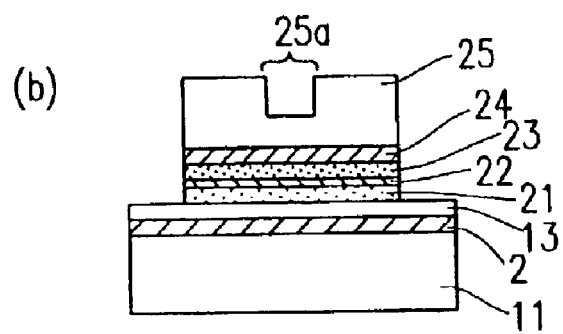
Figure 28:
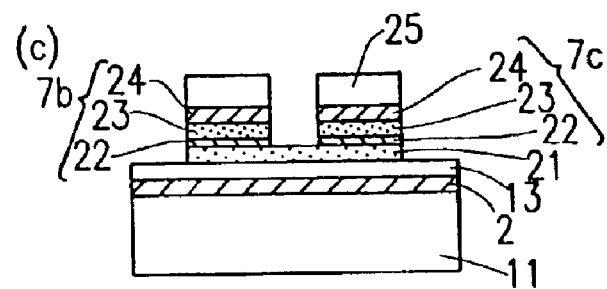

Sections (a) to (c) of FIG. 28 are cross-sectional views taken along line C–C' of section (c) of FIG. 26, which illustrate steps of patterning signal lines and a connection electrode.

Figure 29:
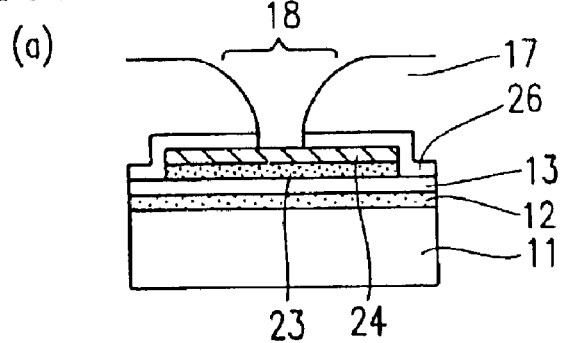
Figure 29:
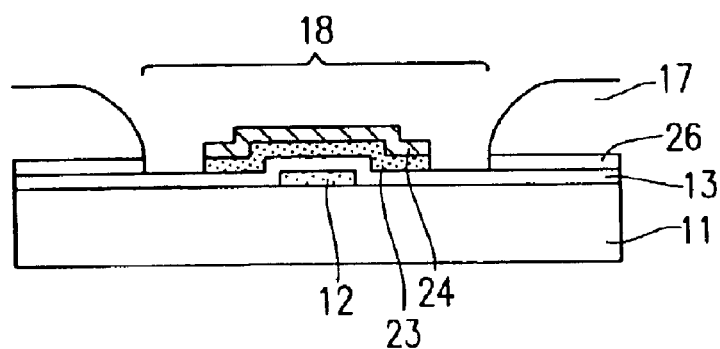

Section (a) of FIG. 29 is a cross-sectional view taken along line H–H' of section (d) of FIG. 26. Section (b) of FIG. 29 is a cross-sectional view taken along line D–D' of section (d) of FIG. 26.

Figure 30:
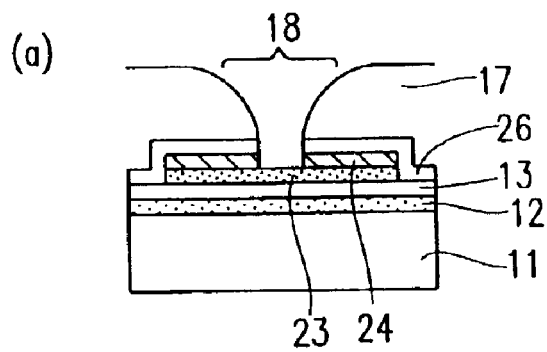
Figure 30:
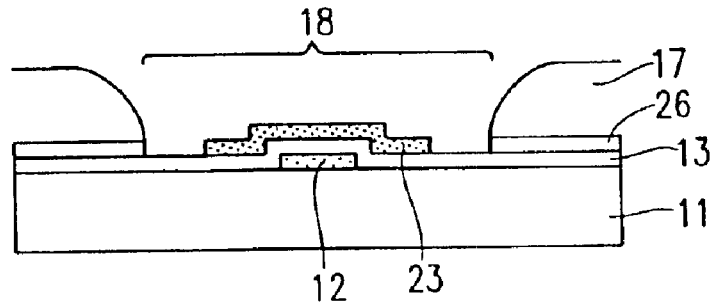

Section (a) of FIG. 30 is a cross-sectional view taken along line R–R' of section (e) of FIG. 26. Section (b) of FIG. 30 is a cross-sectional view taken along line S–S' of section (e) of FIG. 26.

Figure 31:
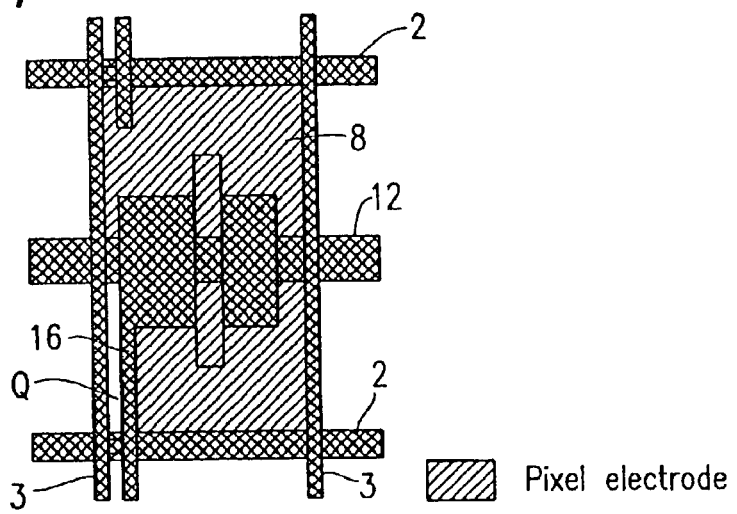

FIG. 31 is a plan view showing a pixel electrode formed by using a photoresist patterned by back surface exposure.

Figure 32:
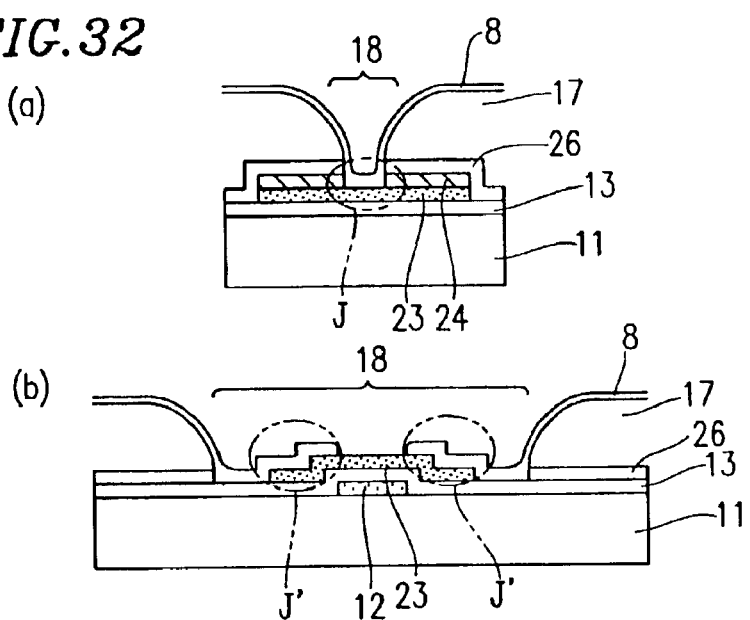

Section (a) of FIG. 32 is a cross-sectional view taken along line T–T' of section (f) of FIG. 26. Section (b) of FIG. 32 is a cross-sectional view taken along line U–U' of section (f) of FIG. 26.

Figure 33:
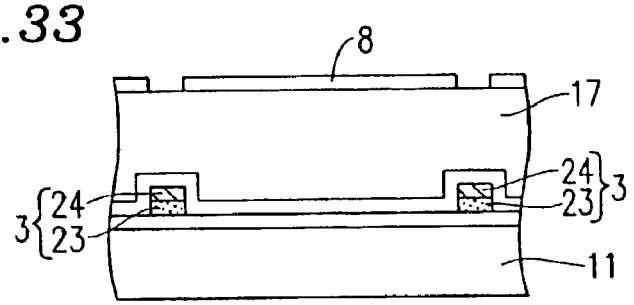

FIG. 33 is a cross-sectional view taken along line V–V' of section (f) of FIG. 26.

Figure 34:
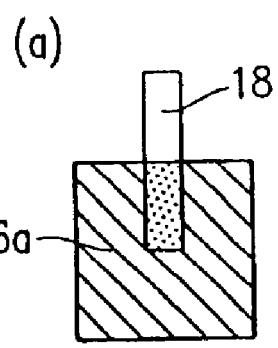
Figure 34:
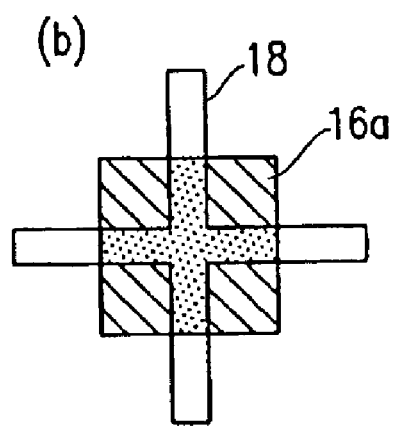
Figure 34:
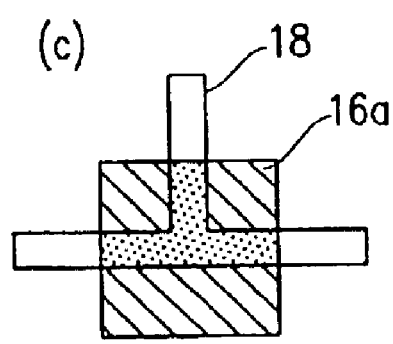
Figure 34:
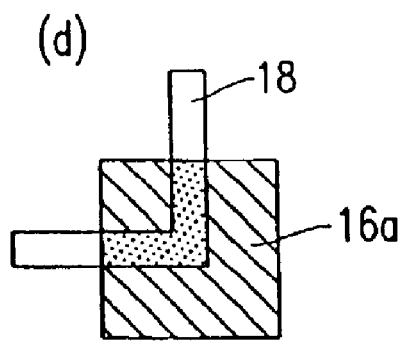
Figure 34:
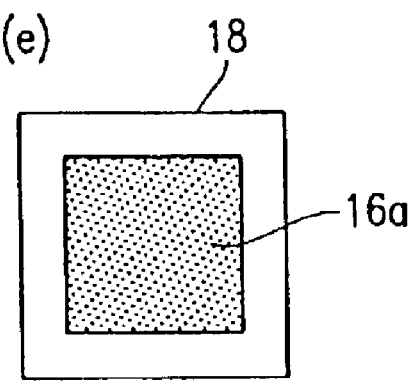
Figure 34:
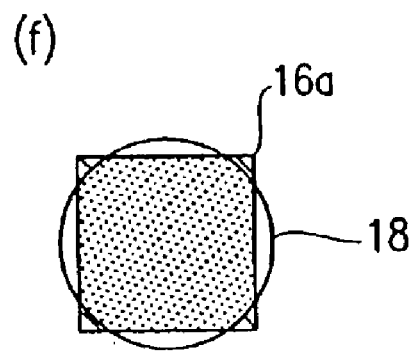

Sections (a) through (f) of FIG. 34 show examples of a contact hole formed so as to extend beyond an edge of a connection electrode.

Figure 35:
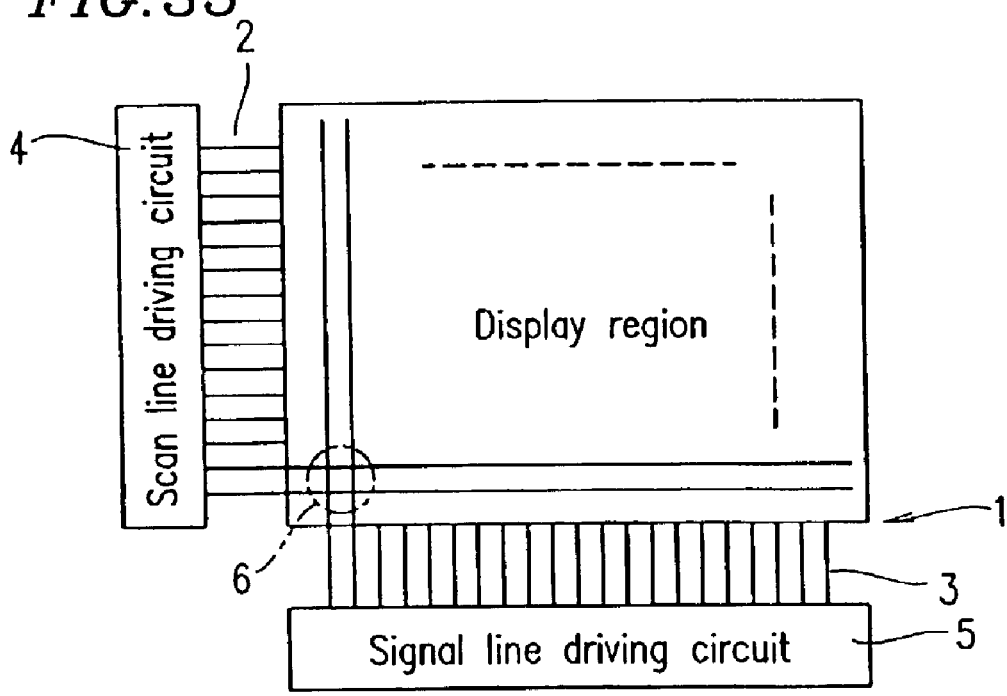

FIG. 35 is a schematic view showing a basic structure of an active matrix substrate which is used in a conventional liquid crystal display device.

Figure 36:
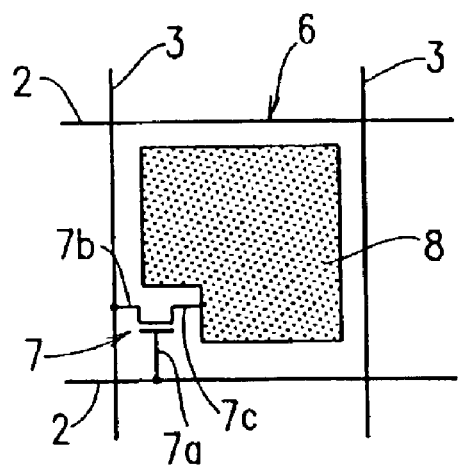

FIG. 36 schematically shows one of the pixels of the conventional active matrix substrate shown in FIG. 35.

Figure 37:
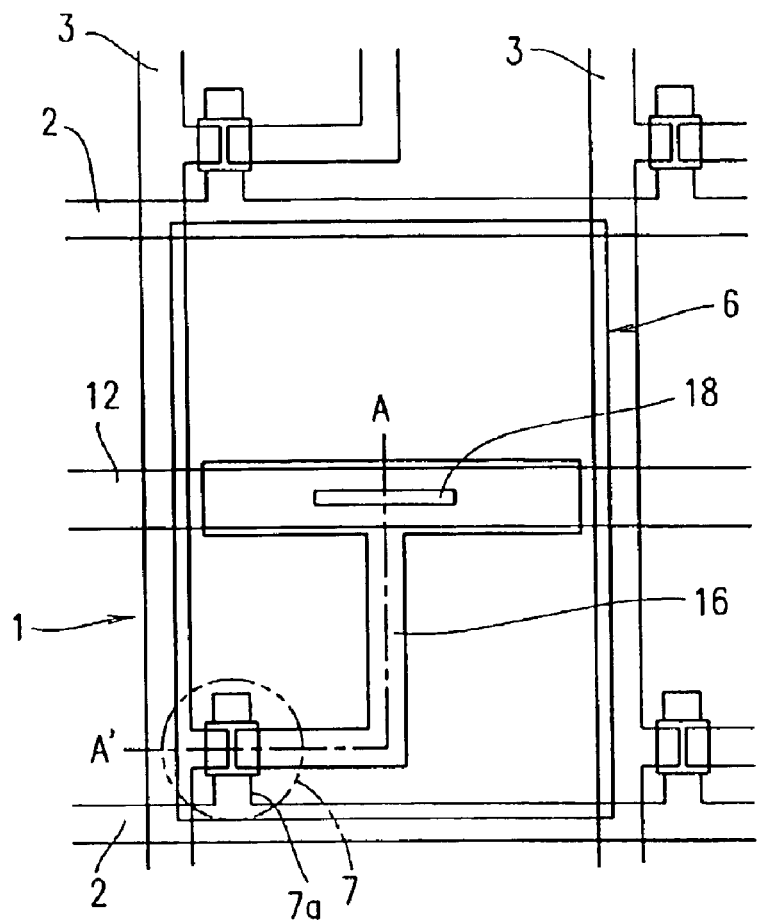

FIG. 37 is an enlarged plan view showing one of the pixels of the conventional active matrix substrate.

Figure 38:
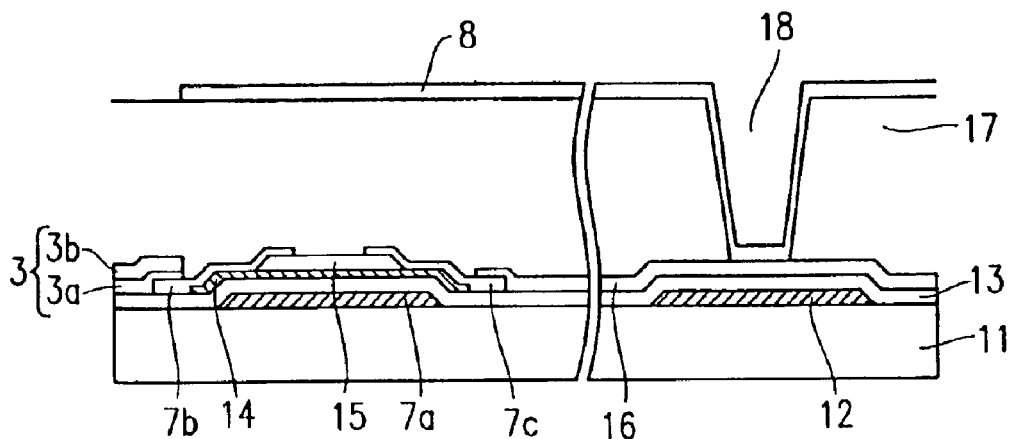

FIG. 38 is a cross-sectional view taken along line A–A' of FIG. 37.

Figure 39:
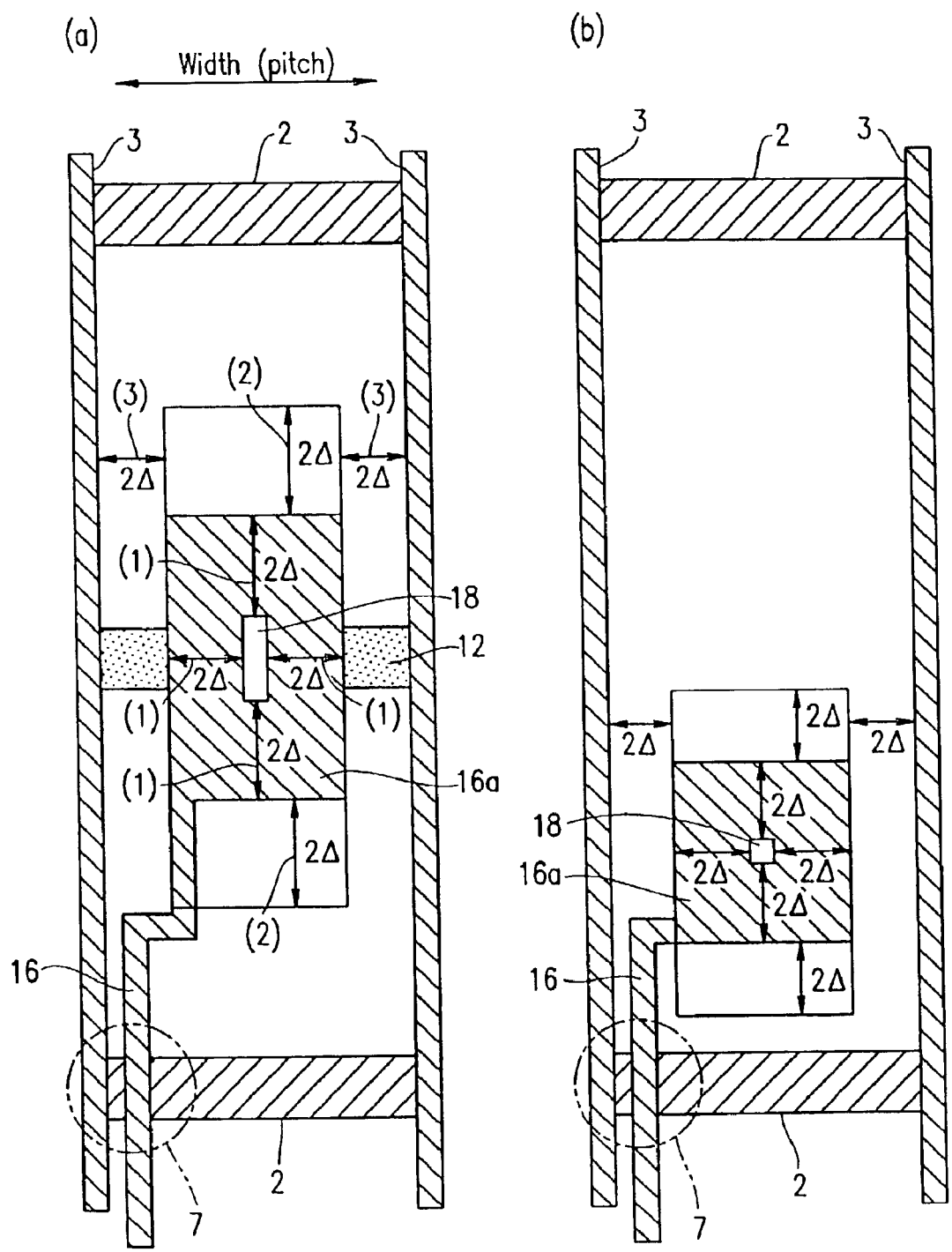

FIG. 39 schematically shows a conventional active matrix substrate which is formed from a plastic substrate. Section (a) shows an active matrix substrate in which an auxiliary capacitive line is formed. Section (b) shows an active matrix substrate in which an auxiliary capacitive line is not formed.

Figure 40:
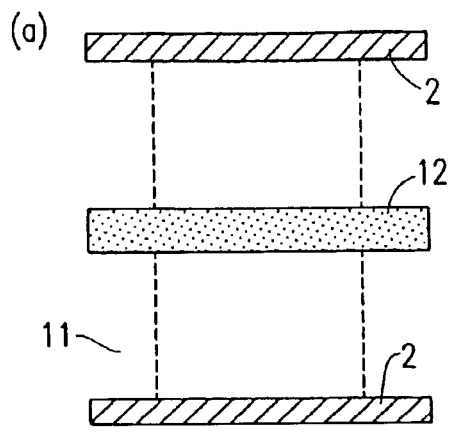
Figure 40:
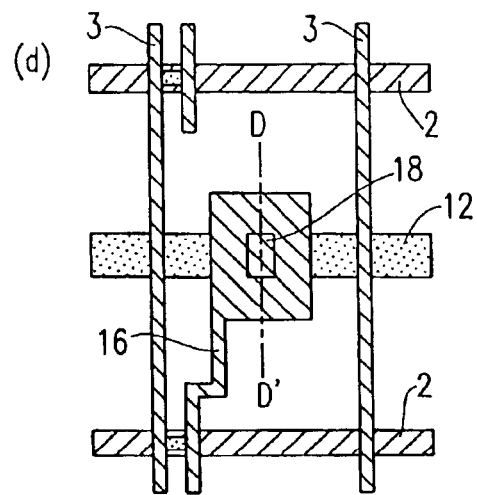
Figure 40:
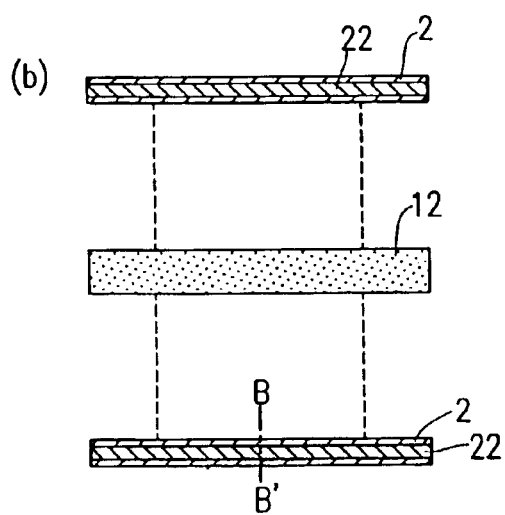
Figure 40:
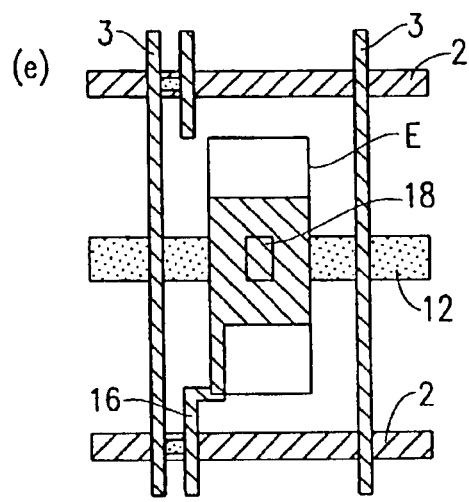
Figure 40:
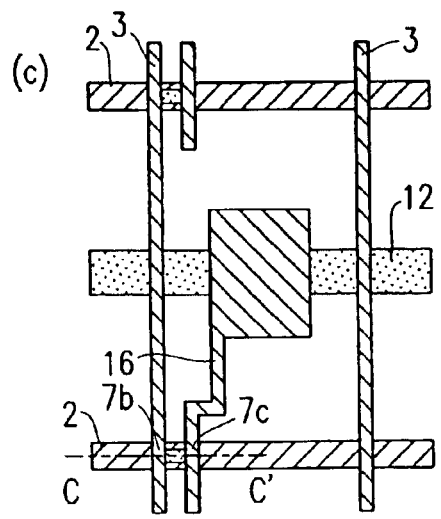
Figure 40:
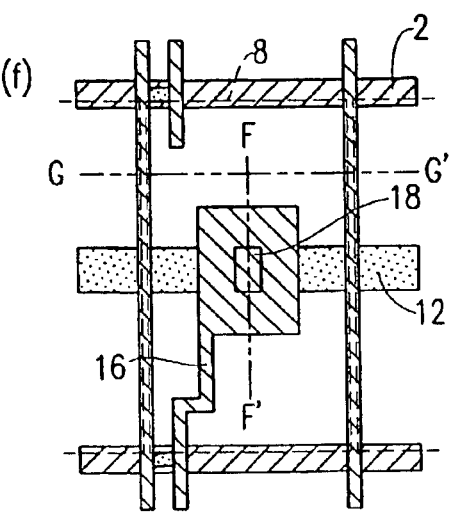

Sections (a) through (f) of FIG. 40 illustrate steps of a method for producing the active matrix substrate formed from a plastic substrate.

Figure 41:
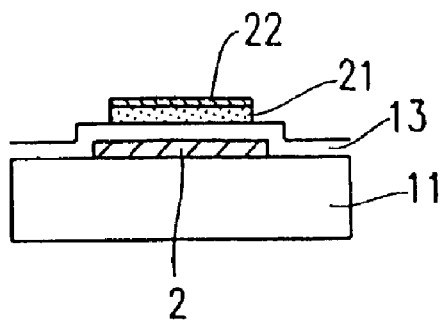

FIG. 41 is a cross-sectional view taken along line B–B' of section (b) of FIG. 40.

Figure 42:
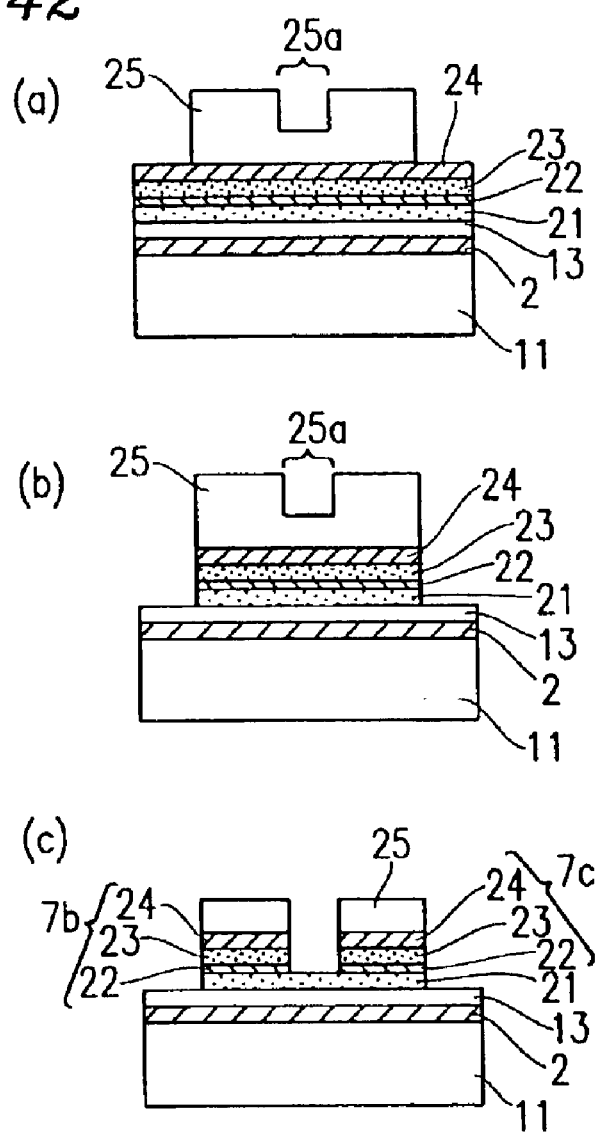

Sections (a) through (c) of FIG. 42 are cross-sectional views taken along line C–C' of section (c) of FIG. 40, which illustrate steps of forming signal lines and a connection electrode.

Figure 43:
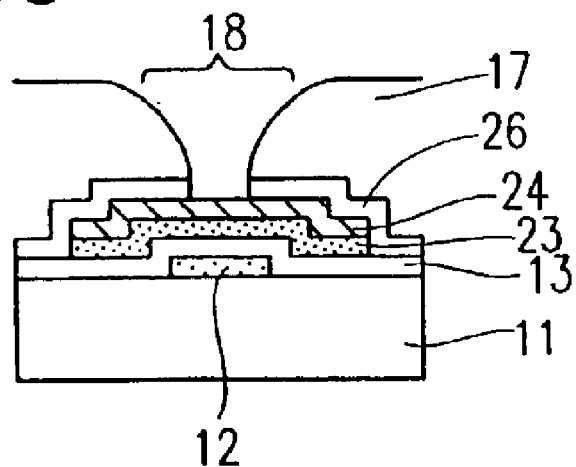

FIG. 43 is a cross-sectional view taken along line D–D' of section (d) of FIG. 40.

Figure 44:
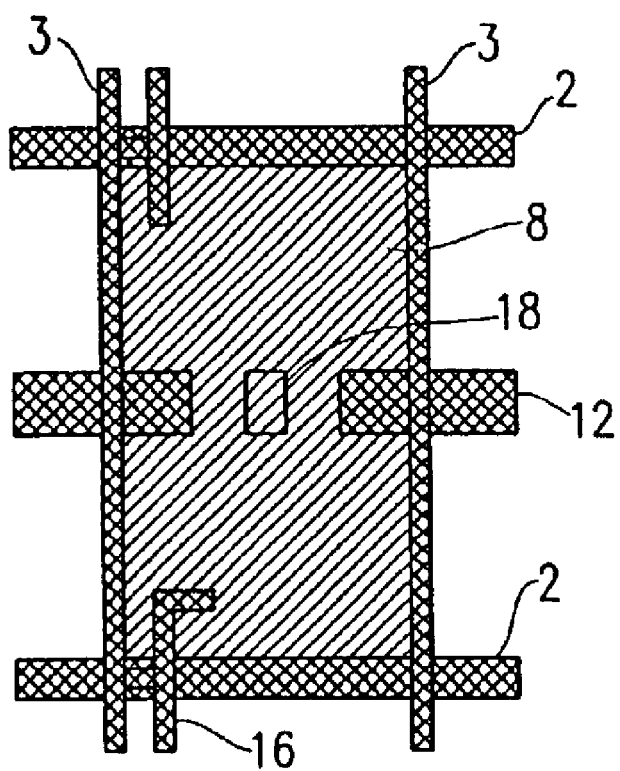

FIG. 44 is a plan view showing a pixel electrode formed by using a photoresist patterned by back surface exposure.

Figure 45:
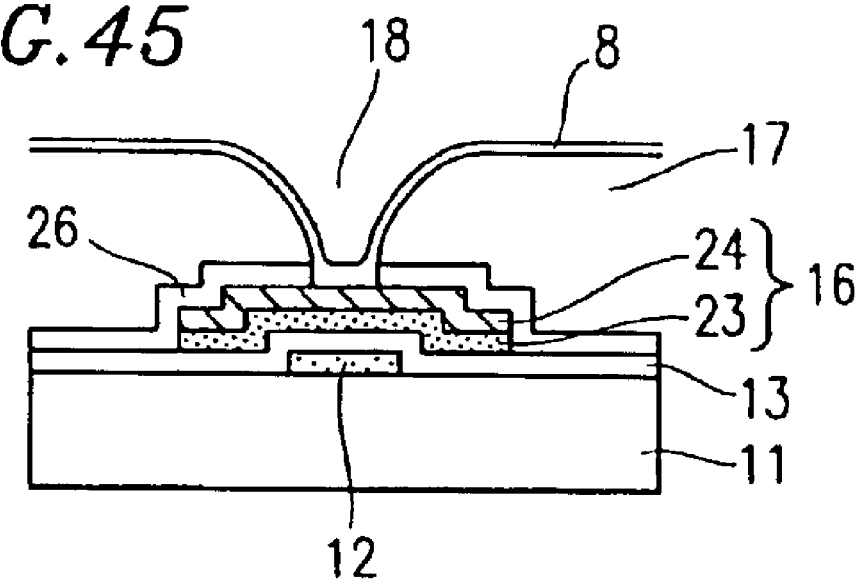

FIG. 45 is a cross-sectional view taken along line F–F' of section (f) of FIG. 40.

Figure 46:
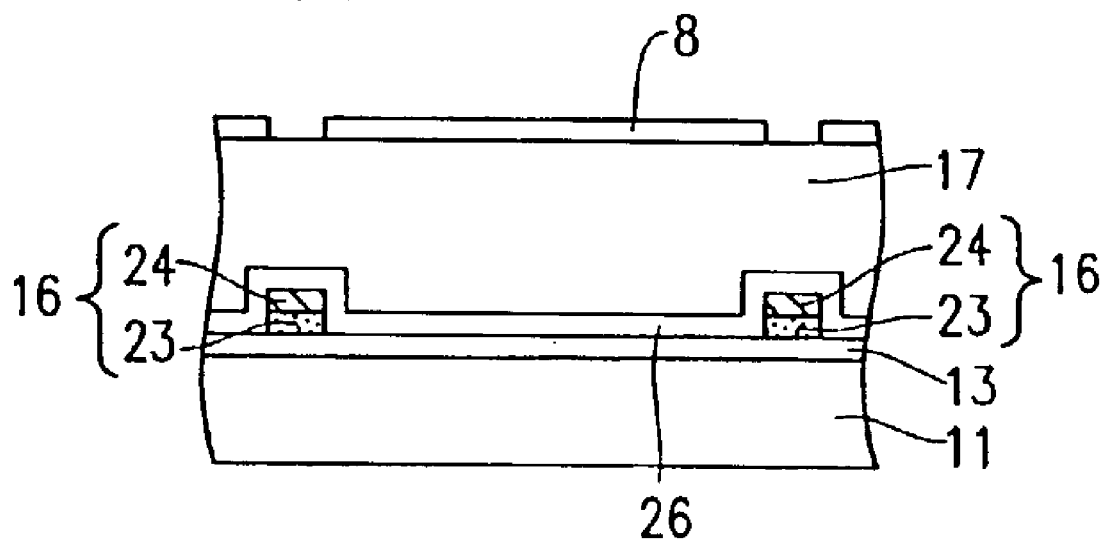

FIG. 46 is a cross-sectional view taken along line G–G' of section (f) of FIG. 40.

DESCRIPTION OF THE PREFERRED EMBODIMENTS

Hereinafter, embodiments of the present invention will be described with reference to the drawings.

(Embodiment 1)

Hereinafter, an active matrix substrate according to embodiment 1 of the present invention is described with reference to the drawings.

Figure 1:
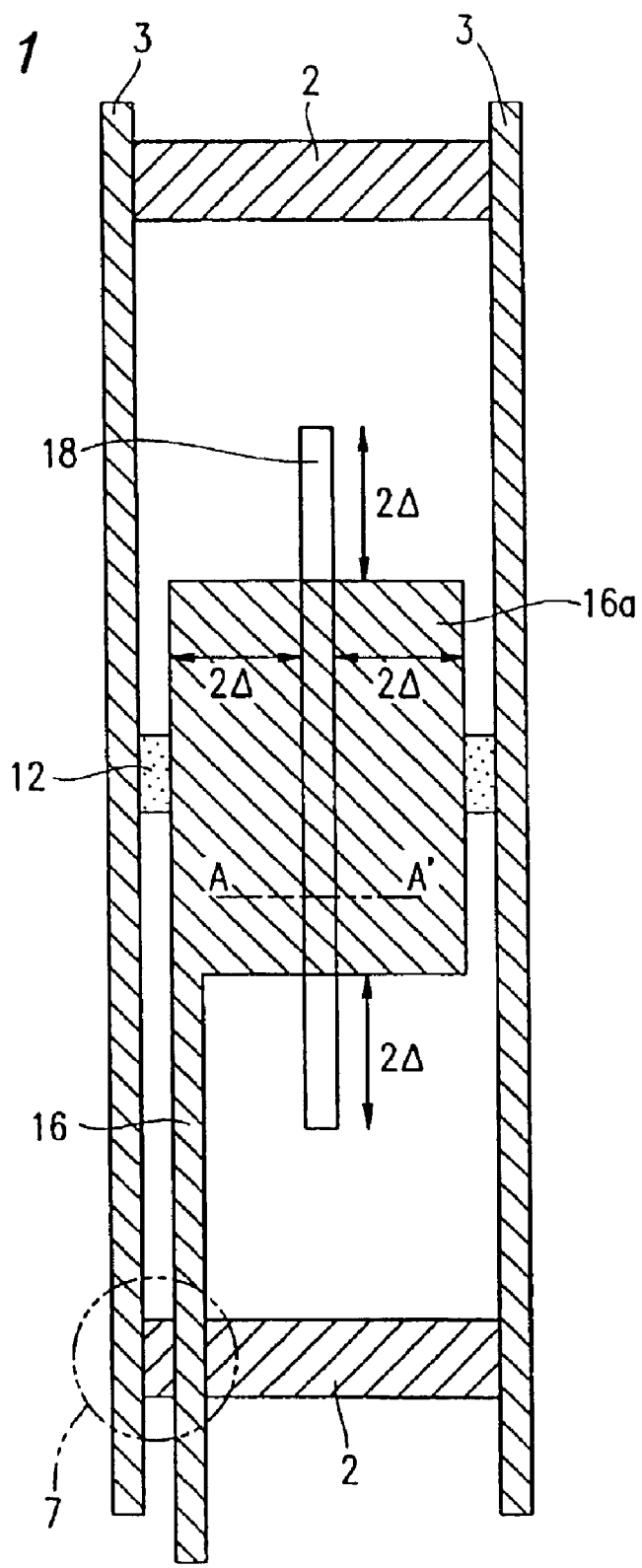
FIG. 1 is an enlarged schematic plan view showing a pixel of an active matrix substrate according to embodiment 1.

FIG. 1 is an enlarged schematic plan view showing a pixel of the active matrix substrate according to embodiment 1.

This active matrix substrate has a plurality of scan lines 2 and a plurality of signal lines 3 which are arranged so as to cross each other. Pixels are formed in regions enclosed by the scan lines 2 and the signal lines 3. A single pixel is the minimum unit for displaying an image on a display device. In a central region between adjacent scan lines 2, an auxiliary capacitive line 12 is formed so as to be in parallel to the scan lines 2.

At each intersection of the scan lines 2 and signal lines 3 which define the pixels, a TFT 7 is formed as a switching element. For each pixel, a TFT 7 is formed at an intersection of one of the two scan lines 2 and one of the two signal lines 3 which define the pixel. At this intersection, the scan line 2 is connected to a gate electrode of the TFT 7, and the signal line 3 is connected to a source electrode of the TFT 7. Further, a connection electrode 16 is formed so as to be parallel to the signal lines 3. A portion of the connection electrode 16 which is in the vicinity of the signal line 3 acts as a drain electrode of the TFT 7. The connection electrode 16 extends from the TFT 7 to the central region of the pixel where the auxiliary capacitive line 12 is provided. In this central region of the pixel, a rectangular electrode portion 16a is provided.

Over the scan lines 2, the signal lines 3, and the connection electrode 16, an interlayer insulating film (not shown in FIG. 1) is formed, and a contact hole 18 is formed in the interlayer insulating film so as to reach the connection electrode 16. The contact hole 18 is formed in the central region between adjacent signal lines 3 so as to be parallel to the signal lines 3. Over the interlayer insulating film having the contact hole 18 formed therein, a pixel electrode (not shown) is formed for each pixel such that the pixel electrode is electrically connected to the connection electrode 16 through the contact hole 18.

Sections (a) through (e) of FIG. 2 are plan views illustrating steps of a method for producing the active matrix substrate according to embodiment 1 of the present invention.

Hereinafter, the method for producing the active matrix substrate is described with reference to FIG. 2.

In the first step, as shown in section (a) of FIG. 2, over a transparent insulative substrate 11 made of a plastic material which transmits light therethrough, a plurality of scan lines 2 are formed of Ti so as to be parallel to each other, and an auxiliary capacitive line 12 is formed of Ti in a central region between the scan lines 2.

In embodiment 1, the scan lines 2 and the auxiliary capacitive line 12 are formed of Ti, but Ta, TaN, Al, Al—Si, Al—Nd, Al—W, Mo, W, Cr, or an alloy thereof may also be used in place of Ti. Alternatively, the scan lines 2 and the auxiliary capacitive line 12 may be a multi-layered film formed by a combination of some of the above materials.

Next, a gate insulating film 13 (FIG. 3) is formed over the entire upper surface of the insulative substrate 11, and then, an amorphous Si layer 21 and an n$^+$ amorphous Si layer 22 (FIG. 3) are sequentially formed over the gate insulating film 13 by a plasma CVD method.

Next, a positive-type photoresist is applied over the n$^+$ amorphous Si layer 22 by a spin coating method. Then, the lower surface side of the insulative substrate 11 (on which the scan lines 2 or the like are not formed) is irradiated with ultraviolet light, such that a resist pattern is formed by using the scan lines 2 and the auxiliary capacitive line 12 as a mask. Thereafter, a mask is formed on the scan lines 2, and the upper surface side of the insulative substrate 11 is irradiated with ultraviolet light, such that the photoresist over the auxiliary capacitive line 12 is removed.

Next, the resultant photoresist layer is used as a mask to etch the n$^+$ amorphous Si layer 22 and the amorphous Si layer 21 using a dry etching method, such that the n$^+$ amorphous Si layer 22 and the amorphous Si layer 21 are left on the scan lines 2 so as to form a stripe pattern. FIG. 3 is a cross-sectional view taken along line B–B' of section (b) of FIG. 2. FIG. 3 shows the amorphous Si layer 21 and the n$^+$ amorphous Si layer 22 formed through the above etching step on and along the scan line 2.

Next, an opaque electrode layer 24 is formed of Ti by sputtering.

In embodiment 1, the opaque electrode layer 24 is formed of Ti, but Ta, TaN, Al, Al—Si, AlNd, Al—W, Mo, W, Cr, or an alloy thereof may be used in place of Ti. Alternatively, the opaque electrode layer 24 may be a multi-layered film formed by a combination of some of the above materials.

Next, over the opaque electrode layer 24, a photoresist 25 is formed for patterning the signal lines 3 and the connection electrode 16.

Sections (a) to (a) of FIG. 4 are cross-sectional views taken along line C–C' of section (c) of FIG. 2, which illustrate steps of patterning the signal lines 3 and the connection electrode 16. In these steps, a half-tone mask is formed in a region which will be a channel region of the TFT 7. The half-tone mask causes this region to be insufficiently exposed such that the insufficiently-exposed portion (i.e., half exposure portion 25a) becomes thinner than the other portion of the photoresist 25. The "half-tone mask" is a mask which forms, in a desired region of a photoresist pattern, an insufficient exposure region whose thickness is thinner than the other regions of the photoresist pattern. For example, the half-tone mask may be a mask partially including insufficient light-transmissive portions through which light from an exposure apparatus is not sufficiently transmitted. Specifically, the half-tone mask may include thin-wire stripes of insufficient light-transmissive portions. Alternatively, the half-tone mask may be a mask partially including light-diffusive portions.

In embodiment 1, the half-tone mask is used to form the half exposure portion 25a. However, according to the present invention, any other means may be used so long as the same half exposure portion 25a can be formed.

After the photoresist layer 25 has been formed, the photoresist layer 25 is used as a mask to remove by dry etching the opaque electrode layer 24, the n$^+$ amorphous Si layer 22, and the amorphous Si layer 21 except for portions which will be the signal lines 3 or the connection electrode 16, as shown in section (b) of FIG. 4.

Next, in the half exposure portion 25a, the photoresist layer 25 is removed, and the opaque electrode layer 24 and the n$^+$ amorphous Si layer 22 are then etched away so as to form a source electrode 7b and a drain electrode 7c of the TFT 7 as shown in section (a) of FIG. 4.

Through the above steps, a TFT 7, which functions as a switching element, can be accurately formed at an intersection of a scan line 2 and a signal line 3 even when a displacement is caused in the alignment of the patterns of the signal lines 3, the source electrode 7b of the TFT 7, and the drain electrode 7c of the TFT 7, with respect to the pattern of the scan lines 2, due to extension and contraction of the insulative substrate 11 which may occur after formation of the scan lines 2.

Next, over the entire resultant structure at the upper surface side of the insulative substrate 11, a TFT protection film 26 (FIG. 5) is formed of SiN$_x$ by a plasma CVD method. Thereafter, over the entire TFT protection film 26, an interlayer insulative film 17 is formed of an acrylic photosensitive organic resin by a spin coating method.

Next, through an exposure step and a development step which uses an alkali solution, a contact hole 18 is formed in the interlayer insulative film 17 over the electrode portion 16a of the connection electrode 16 so as to extend along the signal lines 3 as shown in section (d) of FIG. 2. The contact hole 18 is formed so as to extend beyond edges of the electrode portion 16a by at least 2Δ.

Next, the interlayer insulative film 17 is used as an etching mask so as to etch away the TFT protection film 26 in the contact hole 18.

Section (a) of FIG. 5 is a cross-sectional view taken along line H–H' of section (d) of FIG. 2. Section (b) of FIG. 5 is a cross-sectional view taken along line D–D' of section (d) of FIG. 2. Sections (a) and (b) of FIG. 5 show that the contact hole 18 formed in the interlayer insulative film 17 reaches the opaque electrode layer 24 under the TFT protection film 26 which will be a part of the connection electrode 16.

In embodiment 1, a two-layered structure including the TFT protection film 26 of SiN$_x$ and the interlayer insulating film 17 of an organic resin material formed thereon is provided. However, only an inorganic layer of SiN$_x$, or the like, or only an organic resin layer may be formed. When the interlayer insulating film 17 is formed by only an inorganic layer of SiN$_x$ or the like, the patterning is performed at an exposure step after the photoresist has been applied, and the inorganic layer is etched before the photoresist is removed.

Next, a transparent conductive film of ITO, which will be a pixel electrode 8, is formed by sputtering, and a negative-type photoresist is applied over this transparent conductive film. Then, the scan lines 2, the signal lines 3, the auxiliary capacitive line 12, and the connection electrode 16 are used as masks to perform a back surface exposure process on the resultant structure such that the applied photoresist layer is left only in regions through which light has been transmitted. In this way, a pattern of photo resist, which has been left in regions where a pixel electrode 8 is to be formed, is completed.

The patterned photoresist is used as a mask to etch the transparent conductive film by wet etching so as to form a pixel electrode 8 as shown in section (e) of FIG. 2.

FIG. 6 shows the pixel electrode 8 of a pixel, which is formed by using the above photoresist pattern (shown by slanted lines in FIG. 6) formed by back surface exposure.

As described above, the contact hole 18 is formed along the signal lines 3 so as to extend beyond edges of the electrode portion 16a of the connection electrode 16 by at least 2Δ. Thus, when the back surface exposure process (i.e., exposure from the lower surface side of the insulative substrate 11) is performed for patterning the photoresist layer which is used to form the pixel electrode 8, a portion of light emitted from the lower surface side of the insulative substrate 11 detours as diffracted light around the electrode portion 16a of the connection electrode 16 so as to expose the negative-type photoresist over the electrode portion 16a to the light. Thus, when the above photoresist is used as a mask to perform etching so as to form the pixel electrode 8, a portion of the pixel electrode 8 is superposed over the connection electrode 16. At this portion, the pixel electrode 8 is electrically connected to the electrode portion 16a of the connection electrode 16.

FIG. 7 is a cross-sectional view taken along line I–I' of section (e) of FIG. 2. FIG. 7 shows that the pixel electrode 8 formed over the interlayer insulating film 17 is superposed in encircled regions J over the opaque electrode layer 24 which will be a part of the electrode portion 16a of the connection electrode 16.

FIG. 8 is a cross-sectional view taken along line G–G' of section (e) of FIG. 2. FIG. 8 shows that the pixel electrode 8 formed over the interlayer insulating film 17 is provided for each pixel in an area between the adjacent signal lines 3.

Referring to FIG. 6, regions except for the regions where the scan lines 2, the signal lines 3, the auxiliary capacitive line 12, and the connection electrode 16 are formed are regions through which light is transmitted for exposing the negative-type photoresist. Thus, through the back surface exposure process, the transparent conductive film is formed in a gap region Q between the signal line 3 and the connection electrode 16. However, the transparent conductive film in the region Q is not electrically connected to the pixel electrode 8, and accordingly, a voltage is not applied in the region Q. Thus, in the case where such a pixel shown in FIG. 6 is used to form a liquid crystal cell, a voltage cannot be applied to a liquid crystal layer in the region Q. Therefore, in a counter substrate (not shown) which faces the insulative substrate 11 when the liquid crystal cell is formed, a light-shielding region is formed in a region corresponding to the region Q such that light is prevented from being transmitted through the region Q.

Through the above steps, the active matrix substrate is completed. In embodiment 1, since the pixel electrode 8 is formed by using only the back surface exposure process, the minimum pitch of the scan lines 2, the minimum pitch of the signal lines 3, and the pitch between the contact hole 18 and the electrode portion 16a of the connection electrode 16 can be 4Δ. Thus, a large margin can be provided for a displacement in alignment of the pixel electrode 8 and the connection electrode 16. Even in the active matrix substrate which is produced based on a plastic substrate, the pitch of the pixel electrodes 8 can be reduced. Therefore, the pixel electrodes 8 can be formed at higher density.

Further, since the contact hole 18 is formed so as to extend along the signal lines 3 beyond the edges of the electrode portion 16a of the connection electrode 16 by at least 2Δ, a displacement in alignment which may be caused in the direction along which the signal lines 3 extend can be prevented.

Furthermore, since it is not necessary to perform the front surface exposure process, the number of masks and the number of exposure steps can be reduced, and accordingly, the production cost can be reduced.

(Embodiment 2)

Hereinafter, an active matrix substrate according to embodiment 2 of the present invention is described with reference to the drawings.

FIG. 9 is an enlarged schematic plan view showing a pixel of the active matrix substrate according to embodiment 2.

This active matrix substrate has a plurality of scan lines 2 and a plurality of signal lines 3 which are arranged so as to cross each other. Pixels are formed in regions enclosed by the scan lines 2 and the signal lines 3.

At each intersection of the scan lines 2 and signal lines 3 which define the pixels, a TFT 7 is formed as a switching element. For each pixel, a TFT 7 is formed at an intersection of one of the two scan lines 2 and one of the two signal lines 3 which define the pixel. At this intersection, the scan line 2 is connected to a gate electrode of the TFT 7, and the signal line 3 is connected to a source electrode of the TFT 7. Further, a connection electrode 16 is formed such that a portion of the connection electrode 16 is parallel to the signal lines 3. A portion of the connection electrode 16 which is in the vicinity of the signal line 3 acts as a drain electrode of the TFT 7. The connection electrode 16 extends from the TFT 7 to a predetermined position of the pixel. At the predetermined position of the pixel, a rectangular electrode portion 16a is provided.

Over the scan lines 2, the signal lines 3, the TFT 7, and the connection electrode 16, an interlayer insulating film (not shown in FIG. 9) is formed, and a contact hole 18 is formed in the interlayer insulating film so as to reach the connection electrode 16. The contact hole 18 is formed in the central region between adjacent signal lines 3 so as to be in parallel to the signal lines 3. Over the interlayer insulating film having the contact hole 18 formed therein, a pixel electrode (not shown in FIG. 9) is formed for each pixel such that the pixel electrode is electrically connected to the connection electrode 16 through the contact hole 18.

Sections (a) through (e) of FIG. 10 are plan views illustrating steps of a method for producing the active matrix substrate according to embodiment 2 of the present invention.

Hereinafter, the method for producing the active matrix substrate is described with reference to FIG. 10.

In the first step, scan lines 2 are formed on the insulative substrate 11, and a photoresist layer is formed over the scan lines 2 through the back surface exposure process. Then, the resultant photoresist layer is used to form an amorphous Si layer 21 and an n$^+$ amorphous Si layer 22 into a stripe pattern along the scan lines 2. These steps are the same as those of the method for producing the active matrix substrate of embodiment 1. Thus, detailed descriptions of these steps, which correspond to the steps shown in sections (a) and (b) of FIG. 10, are omitted. Embodiment 2 differs from embodiment 1 in that an auxiliary capacitive line is not formed in embodiment 2. FIG. 11 is a cross-sectional view taken along line B–B' of section (b) of FIG. 10. FIG. 11 shows the amorphous Si layer 21 and the n$^+$ amorphous Si layer 22 formed over the scan line 2. Also, for each of the steps corresponding to sections (a) to (e) of FIG. 10, the same processes as those of embodiment 1 are omitted in the following descriptions.

After the amorphous Si layer 21 and the n$^+$ amorphous Si layer 22 have been formed into a stripe pattern along the scan line 2 as shown in section (b) of FIG. 10, an opaque electrode layer 24, which will be the signal lines 3 and the connection electrode 16, is formed.

Next, over the opaque electrode layer 24, a photoresist 25 is formed for patterning the signal lines 3 and the connection electrode 16.

Sections (a) to (c) of FIG. 12 are cross-sectional views taken along line C–C' of section (c) of FIG. 10, which illustrate steps of patterning the signal lines 3 and the connection electrode 16. In these steps, a half-tone mask is formed in a region which will be a channel region of the TFT 7. The half-tone mask causes this region to be insufficiently exposed such that the insufficiently-exposed portion (i.e., half exposure portion 25a) becomes thinner than the other portion of the photoresist 25.

After the photoresist layer 25 has been formed, the photoresist layer 25 is used as a mask to remove by dry etching the opaque electrode layer 24, the n+ amorphous Si layer 22, and the amorphous Si layer 21 except for portions which will be the signal lines 3 or the connection electrode 16, as shown in section (b) of FIG. 12.

Next, in the half exposure portion 25a, the photoresist layer 25 is removed, and the opaque electrode layer 24 and the n+ amorphous Si layer 22 are then etched away so as to form a source electrode 7b and a drain electrode 7c of the TFT 7 as shown in section (c) of FIG. 12.

Through the above steps, a TFT 7, which functions as a switching element, can be accurately formed at an intersection of a scan line 2 and a signal line 3 even when a displacement is caused in the alignment of the patterns of the signal lines 3, the source electrode 7b of the TFT 7, and the drain electrode 7c of the TFT 7, with respect to the pattern of the scan lines 2, due to extension and contraction of the insulative substrate 11 which may occur after formation of the scan lines 2.

In embodiment 2, a portion of the connection electrode 16 does not function as an electrode for the auxiliary capacitance. Thus, the connection electrode 16 is formed in the vicinity of the TFT 7 which is a switching element.

Next, over the entire resultant structure at the upper surface side of the insulative substrate 11, a TFT protection film 26 (FIG. 5) is formed of $SiN_x$ by a plasma CVD method. Thereafter, over the entire TFT protection film 26, an interlayer insulative film 17 is formed of an acrylic photosensitive organic resin by a spin coating method.

Next, through an exposure step and a development step which uses an alkali solution, a contact hole 18 is formed in the interlayer insulative film 17 over the electrode portion 16a of the connection electrode 16 so as to extend along the signal lines 3 as shown in section (d) of FIG. 10.

In embodiment 2, since the connection electrode 16 is not formed on an auxiliary capacitive line, the contact hole 18 is formed such that one end of the contact hole 18 extends beyond the region of the connection electrode 16 by 2Δ. The contact hole 18 may be formed so as to extend beyond the opposite edges of the connection electrode 16. Next, the interlayer insulative film 17, in which the contact hole 18 has been formed, is used as an etching mask so as to etch away the TFT protection film 26 in the contact hole 18.

Section (a) of FIG. 13 is a cross-sectional view taken along line H–H' of section (d) of FIG. 10. Section (b) of FIG. 13 is a cross-sectional view taken along line D–D' of, section (d) of FIG. 10. Sections (a) and (b) of FIG. 13 show that the contact hole 18 formed in the interlayer insulative film 17 reaches the opaque electrode layer 24 under the TFT protection film 26 which will be a part of the connection electrode 16.

In embodiment 2, a two-layered structure including the TFT protection film 26 of $SiN_x$ and the interlayer insulating film 17 of an organic resin material formed thereon is provided. However, only an inorganic layer of $SiN_x$, or the like, or only an organic resin layer may be formed. When the interlayer insulating film 17 is formed by only an inorganic layer of $SiN_x$ or the like, the patterning is performed at an exposure step after the photoresist has been applied, and the inorganic layer is etched before the photoresist is removed.

Next, a transparent conductive film of ITO, which will be a pixel electrode 8, is formed by sputtering, and a negative-type photoresist is applied over this transparent conductive film. Then, the scan lines 2, the signal lines 3, and the connection electrode 16 are used as masks to perform a back surface exposure process on the resultant structure such that the applied photoresist layer is left only in regions through which light has been transmitted. In this way, a pattern of photoresist, which has been left in regions where a pixel electrode 8 is to be formed, is completed.

The patterned photoresist is used as a mask to etch the transparent conductive film by wet etching so as to form a pixel electrode 8 as shown in section (e) of FIG. 10.

FIG. 14 shows the pixel electrode 8 of a pixel, which is formed by using the above photoresist pattern (shown by slanted lines in FIG. 14) formed by the back surface exposure.

As described above, also in embodiment 2, the contact hole 18 is formed along the signal lines 3 so as to extend beyond edges of the electrode portion 16a of the connection electrode 16 by at least 2Δ. Thus, when the back surface exposure process (i.e., exposure from the lower surface side of the insulative substrate 11) is performed for patterning the photoresist layer which is used to form the pixel electrode 8, a portion of light emitted from the lower surface side of the insulative substrate 11 detours as diffracted light around the electrode portion 16a of the connection electrode 16 so as to expose the negative-type photoresist over the electrode portion 16a to the light. Thus, when the above photoresist is used as a mask to perform etching so as to form the pixel electrode 8, a portion of the pixel electrode 8 is superposed over the connection electrode 16. At this portion, the pixel electrode 8 is electrically connected to the electrode portion 16a of the connection electrode 16.

FIG. 15 is a cross-sectional view taken along line I–I' of section (e) of FIG. 10. FIG. 15 shows that the pixel electrode 8 formed over the interlayer insulating film 17 is superposed in encircled regions J over the opaque electrode layer 24 which will be a part of the electrode portion 16a of the connection electrode 16.

FIG. 16 is a cross-sectional view taken along line G–G' of section (e) of FIG. 10. FIG. 16 shows that the pixel electrode 8 formed over the interlayer insulating film 17 is provided for each pixel in an area between the adjacent signal lines 3.

Through the above steps, the active matrix substrate is completed. In embodiment 2, since the pixel electrode 8 is formed only by using the back surface exposure process without performing front surface exposure, the minimum pitch of the scan lines 2, the minimum pitch of the signal lines 3, and the pitch between the contact hole 18 and the electrode portion 16a of the connection electrode 16 can be 4Δ. Thus, a large margin can be provided for a displacement in alignment of the pixel electrode 8 and the connection electrode 16. Even in the active matrix substrate which is produced based on a plastic substrate, the pitch of the pixel electrodes 8 can be reduced. Therefore, the pixel electrodes 8 can be formed at higher density.

Further, since the contact hole 18 is formed so as to extend along the signal lines 3 beyond edges of the electrode portion 16a of the connection electrode 16 by at least 2Δ, a displacement in alignment which may be caused in the direction along which the signal lines 3 extend can be prevented.

Furthermore, since it is not necessary to perform the front surface exposure process, the number of masks and the number of exposure steps can be reduced, and accordingly, the production cost can be reduced.

(Embodiment 3)

Hereinafter, an active matrix substrate according to embodiment 3 of the present invention is described with reference to the drawings.

The active matrix substrate of embodiment 3 has substantially the same structure as that of the active matrix substrate of embodiment 1. Thus, the detailed descriptions of the same elements are omitted.

Sections (a) through (f) of FIG. 17 are plan views illustrating steps of a method for producing the active matrix substrate according to embodiment 3 of the present invention.

Hereinafter, the method for producing the active matrix substrate of embodiment 3 is described with reference to FIG. 17.

The process from a step where scan lines 2 and an auxiliary capacitive line 12 are formed on the insulative substrate 11 to a step where an amorphous Si layer 21 and an n$^+$ amorphous Si layer 22 are formed into a stripe pattern along the scan lines 2 is substantially the same as those of the method for producing the active matrix substrate of embodiment 1. Thus, detailed descriptions of these steps, which correspond to the steps shown in sections (a) and (b) of FIG. 17, are omitted. FIG. 18 is a cross-sectional view taken along line B–B' of section (b) of FIG. 17. FIG. 18 shows the amorphous Si layer 21 and the n$^+$ amorphous Si layer 22 formed on the gate insulating film 13. Also, for each of the steps corresponding to sections (e) to (f) of FIG. 17, the same processes as those of embodiment 1 are omitted in the following descriptions.

After the amorphous Si layer 21 and the n$^+$ amorphous Si layer 22 have been formed into a stripe pattern along the scan line 2 as shown in section (b) of FIG. 17, an opaque electrode layer 24, which will be the signal lines 3 and the connection electrode 16, is formed.

Next, over the opaque electrode layer 24, a photoresist 25 is formed for patterning the signal lines 3 and the connection electrode 16.

Sections (a) to (c) of FIG. 19 are cross-sectional views taken along line C–C' of section (a) of FIG. 17, which illustrate steps of patterning the signal lines 3 and the connection electrode 16. In these steps, a half-tone mask is formed in a region which will be a channel region of the TFT 7. The half-tone mask causes this region to be insufficiently exposed such that the insufficiently-exposed portion (i.e., half exposure portion 25a) becomes thinner than the other portion of the photoresist 25 as shown in section (a) of FIG. 19.

After the photoresist layer 25 has been formed, the photoresist layer 25 is used as a mask to remove by dry etching the opaque electrode layer 24, the n$^+$ amorphous Si layer 22, and the amorphous Si layer 21 except for portions which will be the signal lines 3 or the connection electrode 16, as shown in section (b) of FIG. 19.

Next, the photoresist layer 25 in the half exposure portion 25a is removed, and then, the resultant photoresist layer 25 is used to etch the opaque electrode layer 24 and the n$^+$ amorphous Si layer 22 so as to form a source electrode 7b and a drain electrode 7c of the TFT 7 as shown in section (c) of FIG. 19.

Through the above steps, a TFT 7, which functions as a switching element, can be accurately formed at an intersection of a scan line 2 and a signal line 3 even when a displacement is caused in the alignment of the patterns of the signal lines 3, the source electrode 7b of the TFT 7, and the drain electrode 7c of the TFT 7, with respect to the pattern of the scan lines 2, due to extension and contraction of the insulative substrate 11 which may occur after formation of the scan lines 2.

Next, over the entire resultant structure at the upper surface side of the insulative substrate 11, a TFT protection film 26 is formed of SiN$_x$ by a plasma CVD method. Thereafter, over the entire TFT protection film 26, an interlayer insulative film 17 is formed of an acrylic photosensitive organic resin by a spin coating method.

Next, through an exposure step and a development step which uses an alkali solution, a contact hole 18 is formed in the interlayer insulative film 17 over the electrode portion 16a of the connection electrode 16 so as to extend along the signal lines 3 as shown in section (d) of FIG. 17.

In embodiment 3, a two-layered structure including the TFT protection film 26 of SiN$_x$ and the interlayer insulating film 17 of an organic resin material formed thereon is provided. However, only an inorganic layer of SiN$_x$, or the like, or only an organic resin layer may be formed. When the interlayer insulating film 17 is formed by only an inorganic layer of SiN$_x$ or the like, the patterning is performed at an exposure step after the photoresist has been applied, and the inorganic layer is etched before the photoresist is removed.

Next, the interlayer insulative film 17, in which the contact hole 18 has been formed, is used as an etching mask so as to etch away the TFT protection film 26 in the contact hole 18.

Section (a) of FIG. 20 is a cross-sectional view taken along line H–H' of section (d) of FIG. 17. Section (b) of FIG. 20 is a cross-sectional view taken along line D–D' of section (d) of FIG. 17. Sections (a) and (b) of FIG. 20 show that the contact hole 18 formed in the interlayer insulative film 17 reaches the opaque electrode layer 24 under the TFT protection film 26 which will be a part of the connection electrode 16.

Subsequently, the opaque electrode layer 24 in the contact hole 18 is removed by etching as shown in section (e) of FIG. 17.

Section (a) of FIG. 21 is a cross-sectional view taken along line K–K' of section (e) of FIG. 17. Section (b) of FIG. 21 is a cross-sectional view taken along line L–L' of section (e) of FIG. 17. Sections (a) and (b) of FIG. 21 show that the opaque electrode layer 24 in the contact hole 18 has been removed.

Next, a transparent conductive film of ITO, which will be a pixel electrode 8, is formed by sputtering, and a negative-type photoresist is applied over this transparent conductive film. Then, the scan lines 2, the signal lines 3, the auxiliary capacitive line 12, and the connection electrode 16 are used as masks to perform a back surface exposure process on the resultant structure such that the applied photoresist layer is left only in regions through which light has been transmitted. In this way, a pattern of photoresist, which has been left in regions where a pixel electrode 8 is to be formed, is completed.

The patterned photoresist is used as a mask to etch the transparent conductive film by wet etching so as to form a pixel electrode 8 as shown in section (f) of FIG. 17.

FIG. 22 shows the pixel electrode 8 of a pixel, which is formed by using the above photoresist pattern (shown by slanted lines in FIG. 22) formed by the back surface exposure.

FIG. 23 is a cross-sectional view taken along line M–M' of section (f) of FIG. 17. FIG. 23 shows that the pixel electrode 8 formed over the interlayer insulating film 17 is electrically connected to the connection electrode 16 (i.e., the opaque electrode layer 24) in encircled regions J. FIG. 24 is a cross-sectional view taken along line N–N' of section (f) of FIG. 17. FIG. 24 shows that the pixel electrode 8 has been formed so as to be partially superposed on the gate insulating film 13, which is provided over the auxiliary capacitive line 12, because of diffraction of light in the back surface exposure process.

FIG. 25 is a cross-sectional view taken along line P–P' of section (f) of FIG. 17. FIG. 25 shows that the pixel electrode 8 formed over the interlayer insulating film 17 is provided for each pixel in an area between the adjacent signal lines 3.

Referring to FIG. 22, regions except for the regions where the scan lines 2, the signal lines 3, the auxiliary capacitive line 12, and the connection electrode 16 are formed are regions through which light is transmitted for exposing the negative-type photoresist. Thus, through the back surface exposure process, the transparent conductive film is formed in a gap region Q between the signal line 3 and the connection electrode 16. However, the transparent conductive film in the region Q is not electrically connected to the pixel electrode 8, and accordingly, a voltage is not applied in the region Q. Thus, in the case where such a pixel shown in FIG. 6 is used to form a liquid crystal cell, a voltage cannot be applied to a liquid crystal layer in the region Q. Therefore, in a counter substrate (not shown) which faces the insulative substrate 11 when the liquid crystal cell is formed, a light-shielding region is formed in a region corresponding to the region Q such that light is prevented from being transmitted through the region Q.

Through the above steps, the active matrix substrate is completed. In embodiment 3, since the photoresist, which is used for forming the pixel electrode 8, is formed only by the back surface exposure process, the minimum pitch of the scan lines 2, the minimum pitch of the signal lines 3, and the pitch between the contact hole 18 and the electrode portion 16a of the connection electrode 16 can be 4Δ. Thus, a large margin can be provided for a displacement in alignment of the pixel electrode 8 and the connection electrode 16. Even in the active matrix substrate which is produced based on a plastic substrate, the pitch of the pixel electrodes 8 can be reduced. Therefore, the pixel electrodes 8 can be formed at a higher density.

In embodiment 3, an area where the pixel electrode is in an electrical contact with the connection electrode (shown in encircled regions J in FIG. 23) is larger than in embodiment 1. Thus, a more sufficient electrical contact can be obtained between the pixel electrode 8 and the connection electrode 16.

In embodiment 3, at the step of forming a photoresist layer which is used to form the pixel electrode 8, light can be transmitted in a region where the connection electrode 16 has been removed. Thus, a larger pixel electrode 8 compared to that of embodiment 1 can be formed.

The above-described active matrix substrate of embodiment 3 has a structure where the connection electrode 16 is formed over the auxiliary capacitive line 12. However, the concept of embodiment 3 can be applied to an active matrix substrate where an auxiliary capacitive line 12 is not formed, for example, the active matrix substrate according to embodiment 2.

(Embodiment 4)

Hereinafter, an active matrix substrate according to embodiment 4 of the present invention is described with reference to the drawings.

The active matrix substrate of embodiment 4 has substantially the same structure as that of the active matrix substrate of embodiment 1. Thus, the detailed descriptions of the same elements are omitted.

Sections (a) through (f) of FIG. 26 are plan views illustrating steps of a method for producing the active matrix substrate according to embodiment 4 of the present invention.

Hereinafter, the method for producing the active matrix substrate of embodiment 4 is described with reference to FIG. 26.

The process from a step where scan lines 2 and an auxiliary capacitive line 12 are formed on the insulative substrate 11 to a step where an amorphous Si layer 21 and an n$^+$ amorphous Si layer 22 are formed into a stripe pattern along the scan lines 2 is substantially the same as those of the method for producing the active matrix substrate of embodiment 1. Thus, detailed descriptions of these steps, which correspond to the steps shown in sections (a) and (b) of FIG. 26, are omitted. FIG. 27 is a cross-sectional view taken along line B–B' of section (b) of FIG. 26. FIG. 27 shows the amorphous Si layer 21 and the n$^+$ amorphous Si layer 22 sequentially formed on the gate insulating film 13. Also, for each of the steps corresponding to sections (a) to (f) of FIG. 26, the same processes as those of embodiment 1 are omitted in the following descriptions.

After the amorphous Si layer 21 and the n$^+$ amorphous Si layer 22 have been formed into a stripe pattern along the scan line 2 as shown in section (b) of FIG. 26, a transparent electrode layer 23 of ITO, which will be a lower layer of the signal lines 3 and the connection electrode 16, and an opaque electrode layer 24 of Ti, which will be an upper layer of the signal lines 3 and the connection electrode 16, are sequentially formed by sputtering.

The transparent electrode layer 23 may be formed of any transparent metal in place of ITO. The opaque electrode layer 24 may be formed of Ta, TaN, Al, Al—Si, AlNd, Al—W, Mo, W, Cr, or an alloy thereof in place of Ti. Alternatively, the opaque electrode layer 24 may be a multi-layered film formed by a combination of some of the above metal materials.

In embodiment 4, the connection electrode 16 is a two-layer film including the transparent electrode layer 23 as the lower layer and the opaque electrode layer 24 as the upper layer. However, the connection electrode 16 is not limited to the two-layer structure as long as the lower most layer of the connection electrode 16 is the transparent electrode layer 23.

Next, over the opaque electrode layer 24, a photoresist 25 is formed for patterning the signal lines 3 and the connection electrode 16.

Sections (a) to (a) of FIG. 28 are cross-sectional views taken along line C–C' of section (c) of FIG. 26, which illustrate steps of patterning the signal lines 3 and the connection electrode 16. In these steps, a half-tone mask is formed in a region which will be a channel region of the TFT 7. The half-tone mask causes this region to be insufficiently exposed such that the insufficiently-exposed portion (i.e., half exposure portion 25a) becomes thinner than the other portion of the photoresist 25 as shown in section (a) of FIG. 28.

After the photoresist layer 25 has been formed, the photoresist layer 25 is used as a mask to remove by dry etching the opaque electrode layer 24, the transparent electrode layer 23, the n$^+$ amorphous Si layer 22, and the amorphous Si layer 21 except for portions which will be the signal lines 3 or the connection electrode 16, as shown in section (b) of FIG. 28.

Next, the photoresist layer 25 in the half exposure portion 25a is removed, and then, the resultant photoresist layer 25 is used to etch the opaque electrode layer 24 and the transparent electrode layer 23 by wet etching. Subsequently, the n$^+$ amorphous Si layer 22 on the scan lines 2 is removed by dry etching so as to form a source electrode 7b and a drain electrode 7c of the TFT 7 as shown in section (c) of FIG. 28.

Through the above steps, a TFT 7 can be accurately formed at an intersection of a scan line 2 and a signal line 3 even when a displacement is caused in the alignment of the patterns of the signal lines 3, the source electrode 7b of the TFT 7, and the drain electrode 7c of the TFT 7, with respect to the pattern of the scan lines 2, due to extension and contraction of the insulative substrate 11 which may occur after formation of the scan lines 2.

Next, over the entire resultant structure at the upper surface side of the insulative substrate 11, a TFT protection film 26 is formed of $SiN_x$ by a plasma CVD method. Thereafter, over the entire TFT protection film 26, an interlayer insulative film 17 is formed of an acrylic photosensitive organic resin by a spin coating method.

Next, through an exposure step and a development step which uses an alkali solution, a contact hole 18 is formed in the interlayer insulative film 17 over the electrode portion 16*a* of the connection electrode 16 so as to extend along the signal lines 3 as shown in section (d) of FIG. 26. Subsequently, the interlayer insulative film 17, in which the contact hole 18 has been formed, is used as an etching mask so as to etch away the TFT protection film 26 in the contact hole 18.

Section (a) of FIG. 29 is a cross-sectional view taken along line H–H' of section (d) of FIG. 26. Section (b) of FIG. 29 is a cross-sectional view taken along line D–D' of section (d) of FIG. 26. Sections (a) and (b) of FIG. 29 show that the contact hole 18 formed in the interlayer insulative film 17 reaches the opaque electrode layer 24 under the TFT protection film 26.

In embodiment 4, a two-layered structure including the TFT protection film 26 of SiN, and the interlayer insulating film 17 of an organic resin material formed thereon is provided. However, only an inorganic layer of $SiN_x$, or the like, or only an organic resin layer may be formed. When the interlayer insulating film 17 is formed by only an inorganic layer of $SiN_x$ or the like, the patterning is performed at an exposure step after the photoresist has been applied, and the TFT protection film 26 formed by the inorganic layer is etched before the photoresist is removed.

Subsequently, the opaque electrode layer 24 in the contact hole 18 is removed by etching as shown in section (e) of FIG. 26.

Section (a) of FIG. 30 is a cross-sectional view taken along line R–R' of section (e) of FIG. 26. Section (b) of FIG. 30 is a cross-sectional view taken along line S–S' of section (e) of FIG. 26. Sections (a) and (b) of FIG. 30 show that the opaque electrode layer 24 in the contact hole 18 has been removed.

Next, a transparent conductive film of ITO, which will be a pixel electrode 8, is formed by sputtering, and a negative-type photoresist is applied over this transparent conductive film. Then, the scan lines 2, the signal lines 3, the auxiliary capacitive line 12, and the transparent electrode layer 23 of the connection electrode 16 are used as masks to perform a back surface exposure process on the resultant structure such that the applied photoresist layer is left only in regions through which light has been transmitted. In this way, a pattern of photoresist, which has been left in regions where a pixel electrode 8 is to be formed, is completed.

The patterned photoresist is used as a mask to etch the transparent conductive film so as to form a pixel electrode 8 as shown in section (f) of FIG. 26.

FIG. 31 shows the pixel electrode 8 of a pixel, which is formed by using the above photoresist pattern (shown by slanted lines in FIG. 31) formed by the back surface exposure.

Section (a) of FIG. 32 is a cross-sectional view taken along line T–T' of section (f) of FIG. 26. Section (a) of FIG. 32 shows that the pixel electrode 8 formed over the interlayer insulating film 17 is electrically connected to the transparent electrode layer 23 and the opaque electrode layer 24 of the connection electrode 16 in an encircled region J. Section (b) of FIG. 32 is a cross-sectional view taken along line U–U' of section (f) of FIG. 26. Section (b) of FIG. 32 shows that the pixel electrode 8 is in an electrical connection to the transparent electrode layer 23 of the connection electrode 16 in encircled regions J', because of removal of the opaque electrode layer 24.

FIG. 33 is a cross-sectional view taken along line V–V' of section (f) of FIG. 26. FIG. 33 shows that the pixel electrode 8 formed over the interlayer insulating film 17 is provided for each pixel in an area between the adjacent signal lines 3.

Referring to FIG. 31, regions except for the regions where the scan lines 2, the signal lines 3, the auxiliary capacitive line 12, and the connection electrode 16 are formed are regions through which light is transmitted for exposing the negative-type photoresist. Thus, through the back surface exposure process, the transparent conductive film is formed in a gap region Q between the signal line 3 and the connection electrode 16. However, the transparent conductive film in the region Q is not electrically connected to the pixel electrode 8, and accordingly, a voltage is not applied in the region Q. Thus, in the case where such a pixel shown in FIG. 6 is used to form a liquid crystal cell, a voltage cannot be applied to a liquid crystal layer in the region Q. Therefore, in a counter substrate (not shown) which faces the insulative substrate 11 when the liquid crystal cell is formed, a light-shielding region is formed in a region corresponding to the region Q such that light is prevented from being transmitted through the region Q.

Through the above steps, the active matrix substrate is completed. In embodiment 4, since the photoresist, which is used for forming the pixel electrode 8, is formed only by the back surface exposure process, the minimum pitch of the scan lines 2, the minimum pitch of the signal lines 3, and the pitch between the contact hole 18 and the electrode portion 16*a* of the connection electrode 16 can be 4Δ. Thus, a large margin can be provided for a displacement in alignment of the pixel electrode 8 and the connection electrode 16. Even in the active matrix substrate which is produced based on a plastic substrate, the pitch of the pixel electrodes 8 can be reduced. Therefore, the pixel electrodes 8 can be formed at higher density.

In embodiment 4, an area where the pixel electrode is in an electrical contact with the connection electrode (shown in encircled regions J and J' in FIG. 32) is larger than in embodiment 1 (shown in encircled regions J in FIG. 7). Thus, a more sufficient electrical contact can be obtained between the pixel electrode 8 and the connection electrode 16.

In embodiment 4, at the step of forming a photoresist layer which is used to form the pixel electrode 8, light can be transmitted in a region where the opaque electrode layer 24 has been removed. Thus, a larger pixel electrode 8 compared to that of embodiment 1 can be formed.

The above-described active matrix substrate of embodiment 4 has a structure where the connection electrode 16 is formed over the auxiliary capacitive line 12. However, the concept of embodiment 4 can be applied to an active matrix substrate where an auxiliary capacitive line 12 is not formed, for example, the active matrix substrate according to embodiment 2.

In each of the above-described active matrix substrates of embodiments 1–4, the contact hole 18 is formed into a rectangular shape so as to extend beyond an edge or opposite edges of the connection electrode 16. However, the contact hole 18 can be formed into any shape so long as a portion of the contact hole 18 extends beyond an edge of the connection electrode 16.

FIG. 34 shows another example of the shape of the contact hole 18 formed in the interlayer insulating film 17.

Section (a) of FIG. 34 shows the shape of the contact hole 18 used in each of embodiments 1–4. The contact hole 18 partially extends beyond an edge of the square electrode portion 16a of the connection electrode 16.

A crossed-shape contact hole 18 shown in section (b) of FIG. 34 has four ends which extend in four directions beyond the four edges of the square electrode portion 16a of the connection electrode 16. A contact hole 18 shown in section (c) of FIG. 34 has three ends which extend in three directions beyond three corresponding edges of the square electrode portion 16a of the connection electrode 16. A contact hole 18 shown in section (d) of FIG. 34 has two ends which extend in two directions beyond two corresponding edges of the square electrode portion 16a of the connection electrode 16.

A contact hole 18 shown in section (e) of FIG. 34 has a square shape which is large enough to entirely cover the electrode portion 16a of the connection electrode 16. If this contact hole 18 is employed in embodiment 4, the opaque electrode layer 24 over the electrode portion 16a is completely removed.

A contact hole 18 shown in section (f) of FIG. 34 is formed into a circle shape over the square electrode portion 16a such that the contact hole 18 extends beyond the edges of the electrode portion 16a.

Even in the case where the contact hole 18 shown in each of sections (a) to (f) of FIG. 34 is employed, since the photoresist, which is used for forming the pixel electrode 8, is formed only by the back surface exposure process, the minimum pitch of the scan lines 2, the minimum pitch of the signal lines 3, and the pitch between the contact hole 18 and the electrode portion 16a can be 4Δ. Thus, a large margin can be provided for a displacement in alignment of the electrode portion 16a that is electrically connected to the pixel electrode 8 and the connection electrode 16. Even in the active matrix substrate which is produced based on a plastic substrate, the pitch of the pixel electrodes 8 can be reduced. Therefore, the pixel electrodes 8 can be formed at a higher density.

As described above, in an active matrix substrate of the present invention, a circumference of a contact hole formed in an interlayer insulating film is outside a circumference of a connection electrode. Thus, in a step of forming a photoresist pattern which is used for forming a pixel electrode, a portion of light emitted from the lower surface side of an insulative substrate detours as diffracted light around the connection electrode so as to expose the photoresist over the connection electrode to the light. Therefore, when such a photoresist is used as a mask to perform etching so as to form a pixel electrode, a portion of the pixel electrode is superposed over the connection electrode. At this portion, the pixel electrode is electrically connected to the connection electrode 16.

Since the photoresist, which is used for forming the pixel electrode, is formed only by the back surface exposure process, a large margin can be provided for a displacement in alignment of the pixel electrode and the connection electrode. Even in an active matrix substrate which is produced based on a plastic substrate, the pitch of the pixel electrodes can be reduced. Therefore, the pixel electrodes can be formed at higher density.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An active matrix substrate, comprising:
    a plurality of scan lines formed on a transparent insulative substrate;
    a plurality of signal lines formed so as to cross the scan lines;
    a plurality of switching elements formed at predetermined intersections of the scan lines and the signal lines, the switching elements being electrically connected to the scan lines and the signal lines;
    a connection electrode formed for each of the intersections so as to be electrically connected to a corresponding one of the switching elements;
    an interlayer insulating film formed over the scan lines, the signal lines, the connection electrode, and the switching elements; a contact hole formed in the interlayer insulating film over the connection electrode; and
    a pixel electrode formed over the interlayer insulating film at each of the intersections, the pixel electrode being electrically connected to the connection electrode through the contact hole,
    wherein each of the scan lines and the signal lines includes an opaque electrode layer; and
    the contact hole is formed such that at least a portion of the area defined by the opening of the contact hole overlies a peripheral edge of the connection electrode.

2. An active matrix substrate according to claim 1, wherein the contact hole is formed into a linear shape such that one end or opposite ends of the contact hole exist outside the connection electrode.

3. An active matrix substrate according to claim 2, wherein the connection electrode is not present in the contact hole.

4. An active matrix substrate according to claim 2, wherein:
    the connection electrode has a layered film including a transparent electrode layer as a lowermost layer and an opaque electrode layer provided on the transparent electrode layer; and
    the opaque electrode layer is not present in the contact hole.

5. An active matrix substrate according to claim 1, wherein the connection electrode is not present in the contact hole.

6. An active matrix substrate according to claim 1, wherein:
    the connection electrode has a layered film including a transparent electrode layer as a lowermost layer and an opaque electrode layer provided on the transparent electrode layer; and
    the opaque electrode layer is not present in the contact hole.

* * * * *